(12) United States Patent
Nakamoto

(10) Patent No.: US 6,720,901 B2
(45) Date of Patent: Apr. 13, 2004

(54) INTERPOLATION CIRCUIT HAVING A CONVERSION ERROR CONNECTION RANGE FOR HIGHER-ORDER BITS AND A/D CONVERSION CIRCUIT UTILIZING THE SAME

(75) Inventor: Hiroyuki Nakamoto, Kawasaki (JP)

(73) Assignee: Fujitsu Limited, Kawasaki (JP)

( * ) Notice: Subject to any disclaimer, the term of this patent is extended or adjusted under 35 U.S.C. 154(b) by 0 days.

(21) Appl. No.: 10/454,694

(22) Filed: Jun. 5, 2003

(65) Prior Publication Data

US 2003/0227405 A1 Dec. 11, 2003

(30) Foreign Application Priority Data

Jun. 5, 2002 (JP) ........................ 2002-164829

(51) Int. Cl.[7] ............................... H03M 1/12
(52) U.S. Cl. .................. 341/156; 341/161; 341/155
(58) Field of Search ................. 341/155, 161, 341/159, 156

(56) References Cited

U.S. PATENT DOCUMENTS 5,841,389 A * 11/1998 Kinugasa et al. ........... 341/159
5,917,378 A * 6/1999 Juang ........................ 330/253
6,501,412 B2 * 12/2002 Tanabe ....................... 341/161

FOREIGN PATENT DOCUMENTS

JP 06-112824 4/1994
JP 06-152413 5/1994

* cited by examiner

Primary Examiner—Peguy JeanPierre
(74) Attorney, Agent, or Firm—Arent Fox PLLC

(57) ABSTRACT

An interpolation circuit for generating interpolation and extrapolation differential voltages to a first and second differential input voltages, comprises a first and second differential amplifiers for inputting the first and second differential input voltages, respectively, and for generating a differential output voltage respectively between their inverted output terminal and their respective non-inverted terminal. The interpolation circuit further comprises a first voltage dividing element array disposed between the non-inverted output terminals of the first and second differential amplifiers, and a second voltage dividing element array disposed between the inverted output terminals of the first and second differential amplifiers, so that the interpolation differential voltages are generated from nodes in the first voltage dividing element array and nodes in the second voltage dividing element array. The interpolation circuit further comprises a third voltage dividing element array disposed between the inverted output terminal of the first differential amplifier and the non-inverted output terminal of the second differential amplifier, so that at least a pair of extrapolation differential voltages are generated from nodes in the third voltage dividing element array.

18 Claims, 20 Drawing Sheets

A,B: DIFFERENTIAL AMPLIFIER
NT1,2,3: VOLTAGE DIVIDING ELEMENT ARRAY

A,B : DIFFERENTIAL AMPLIFIER
NT1,2,3 : RESISTOR ELEMENTS ARRAY

- $Va = V_{in} - 2V_{ref}$
- $Vb = V_{in} - V_{ref}$
- $Vc = (Va - Vb)/4 = -V_{ref}/4$
- Resistances are all R.

INPUT/OUTPUT CHARACTERISTIC
OF INTERPOLATION CIRCUIT

A,B: DIFFERENTIAL AMPLIFIER
NT1,2,3: RESISTOR ELEMENTS ARRAY
20: COMPARATOR ARRAY

- $Va = V_{in} - 2V_{ref}$
- $Vb = V_{in} - V_{ref}$
- $Vc = (Va - Vb)/4 = -V_{ref}/4$
- Resistances are all R.

A,B: DIFFERENTIAL AMPLIFIER
NT1,2,5,6: VOLTAGE DIVIDING ELEMENT ARRAY

A,B : DIFFERENTIAL AMPLIFIER
NT1,2,5,6 : RESISTOR ELEMENTS ARRAY

- $Va = V_{in} - 2V_{ref}$
- $Vb = V_{in} - V_{ref}$
- $Vc = (Va - Vb)/4 = -V_{ref}/4$
- All resistors without indication are R.

INPUT/OUTPUT CHARACTERISTIC
OF INTERPOLATION CIRCUIT

A,B: DIFFERENTIAL AMPLIFIER
NT1,2,5,6: RESISTOR ELEMENTS ARRAY
20: COMPARATOR ARRAY

- $Va = V_{in} - 2V_{ref}$
- $Vb = V_{in} - V_{ref}$
- $Vc = (Va - Vb)/4 = -V_{ref}/4$
- All resistors without indication are R.

A,B: DIFFERENTIAL AMPLIFIER
NT7,8,9,10: VOLTAGE DIVIDING ELEMENT ARRAY

- $Va = V_{in} - 2V_{ref}$
- $Vb = V_{in} - V_{ref}$
- $Vc = (Va - Vb) / 4 = -V_{ref} / 4$ A,B: DIFFERENTIAL AMPLIFIER
NT7,8,9,10: RESISTOR ELEMENTS ARRAY
- All resistors without indication are R.

INPUT/OUTPUT CHARACTERISTIC OF INTERPOLATION CIRCUIT

A,B : DIFFERENTIAL AMPLIFIER
NT7,8,9,10 : RESISTOR ELEMENTS ARRAY
20 : COMPARATOR ARRAY

- $Va = V_{in} - 2V_{ref}$
- $Vb = V_{in} - V_{ref}$
- $Vc = (Va - Vb) / 4 = -V_{ref} / 4$
- All resistors without indication are R.

A,B: DIFFERENTIAL AMPLIFIER
NT3,7,8,9,10: VOLTAGE DIVIDING ELEMENT ARRAY

A,B: DIFFERENTIAL AMPLIFIER
NT3,7,8,9,10: RESISTOR ELEMENTS ARRAY

- $Va = V_{in} - 2V_{ref}$
- $Vb = V_{in} - V_{ref}$
- $Vc = (Va - Vb)/4 = -V_{ref}/4$
- All resistors without indication are R.

INPUT/OUTPUT CHARACTERISTIC OF INTERPOLATION CIRCUIT

A,B: DIFFERENTIAL AMPLIFIER
NT3,7,8,9,10: RESISTOR ELEMENTS ARRAY
20: COMPARATOR ARRAY

- $Va = V_{in} - 2V_{ref}$
- $Vb = V_{in} - V_{ref}$
- $Vc = (Va - Vb) / 4 = -V_{ref}/4$
- All resistors without indication are R.

A,B: DIFFERENTIAL AMPLIFIER
NT5~10: VOLTAGE DIVIDING ELEMENT ARRAY

A,B: DIFFERENTIAL AMPLIFIER
NT5~10: RESISTOR ELEMENTS ARRAY

- $Va = V_{in} - 2V_{ref}$
- $Vb = V_{in} - V_{ref}$
- $Vc = (Va - Vb)/4 = -V_{ref}/4$
- All resistors without indication are R.

INPUT/OUTPUT CHARACTERISTIC OF INTERPOLATION CIRCUIT

A,B: DIFFERENTIAL AMPLIFIER
NT5~10: RESISTOR ELEMENTS ARRAY
20: COMPARATOR ARRAY

- $Va = V_{in} - 2V_{ref}$
- $Vb = V_{in} - V_{ref}$
- $Vc = (Va - Vb)/4 = -V_{ref}/4$
- All resistors without indication are R.

INTERPOLATION CIRCUIT HAVING A CONVERSION ERROR CONNECTION RANGE FOR HIGHER-ORDER BITS AND A/D CONVERSION CIRCUIT UTILIZING THE SAME

CROSS-REFERENCE TO RELATED APPLICATIONS

This application is based upon and claims the benefit of priority from the prior Japanese Patent Application No. 2002-164829, filed on Jun. 5, 2002, the entire contents of which are incorporated herein by reference.

BACKGROUND OF THE INVENTION

1. Field of the Invention

The present invention relates generally to an interpolation circuit having a conversion error correction range for higher-order bits and an A/D conversion circuit utilizing the interpolation circuit, and more particularly to an interpolation circuit that can be realized in a reduced circuit scale, that can be arranged in a multi-stage configuration and that can equalize the common level of the interpolation circuit output, and to an A/D conversion circuit utilizing the interpolation circuit.

2. Description of the Related Art

With the popularization of the digital signal processing technology in recent years, lower power consumption and higher precision have been demanded of A/D conversion circuits that convert analogue signals into digital signals. As an A/D conversion circuit that meets these demands, series-parallel-type A/D conversion circuits utilizing interpolation circuits have been proposed.

FIG. 1 is a circuit diagram illustrating a conventional interpolation-type A/D conversion circuit. This A/D conversion circuit has a reference voltage generation circuit 1 for generating finely divided reference voltages V0 to V8 consisting of voltage dividing elements connected in series between reference power sources VRB and VRT, a differential amplifier array 2 for amplifying respectively the differential voltages between the reference voltages V0 to V8 and an analogue input voltage VIN, switches 3, a higher-order comparator array 4 for comparing differential outputs of each of differential amplifiers and for outputting a positive or a negative output and a higher-order encoder 7 for generating a three (3)-bit digital output by encoding an output of the higher-order comparator 4.

Assuming that the input voltage VIN is positioned between reference voltages V3 and V4, since VIN-V3>0 and VIN-V4<0, comparators corresponding to the reference voltages respectively outputs a positive output and a negative output so that a higher-order three (3)-bit digital value is detected. That is, where the input voltage VIN is positioned among the reference voltages V0 to V8 is detected by the higher-order comparator array 4 and the result is converted into a three (3)-bit digital value by the encoder 7. A switch in the switches 3 is controlled in response to this higher-order digital value, and the outputs from differential amplifiers connected to the reference voltages V3 and V4 respectively are supplied through switches 3 to a pair of differential amplifiers 5 and 6 in the next stage.

From the differential outputs of the differential amplifiers 5 and 6, a plurality of discrete differential voltages between the differential outputs of the differential amplifiers 5 and 6 are further generated by an interpolation circuit consisting of a voltage dividing element array 8 between the inverted outputs AN and BN of the amplifiers 5 and 6 and a voltage dividing element array 9 between the non-inverted outputs AP and BP of the amplifiers 5 and 6. The discrete differential voltages V13–V17, V23–V27 are supplied respectively to the lower-order comparator arrays 10, 11 and 12. That is, these interpolated differential voltages are input into the lower-order comparator arrays. Then, a lower-order encoder 13 outputs a lower-order two (2)-bit digital value from the outputs of the comparator arrays 10, 11 and 12. A summation circuit 14 sums the higher-order three (3)-bit digital value and the lower-order two (2)-bit digital value and outputs the sum.

FIG. 2 illustrates the principle of the operation of the A/D converter shown in FIG. 1. The axis of abscissas representing the input voltage VIN shows the relation between the input voltage VIN and the reference voltages V0 to V8. The position of the input voltage VIN for the three higher-order bits is detected according to whether the each output (VIN-V1) to (VIN-V7) of the differential amplifier array 2 is positive or negative when the amplification factor of the array 2 is assumed to be 1. In this case, since the analogue input voltage VIN is between the reference voltages V3 and V4, the position of the input voltage VIN can be detected from VIN-V3>0 (the arrow pointing upward) and VIN-V4<0 (the arrow pointing downward) Furthermore, VIN-V3 and VIN-V4 are supplied respectively to the lower-order differential amplifiers 5 and 6 and are amplified by a factor of m when the amplification factor of the amplifiers 5 and 6 is assumed to be m.

Then, the discrete differential voltages V26–V16, V25–V15 and V24–V14 between those amplified differential voltages (VIN-V3)×m and (VIN-V4)×m are generated by the voltage dividing element arrays 8 and 9 and are supplied to the lower-order comparator array 10. Since the border between positive outputs and negative outputs of the comparator array 10 is the level of the input voltage VIN at this moment, two (2) lower-order bits can be detected from the outputs of the comparator array 10.

As apparent from the above description, the interpolation voltages dividing the voltage between the differential outputs of the pair of differential amplifiers 5 and 6 can be generated by the circuit networks of the voltage dividing element arrays 8 and 9. Therefore, these circuit networks can be deemed to be interpolation circuits. Then, those interpolation voltages are compared in the comparator arrays 10, 11 and 12 and a lower-order two (2)-bit digital value can be detected using the result of the comparison. A circuit constituted by adding the comparator array to the interpolation circuit can be deemed to be an A/D conversion circuit. These are the definition of the interpolation circuit and the A/D conversion circuit.

If the outputs of the lower-order comparator arrays 10, 11 and 12 shown in FIG. 1 are all positive or negative even when the input voltage VIN is between the reference voltages V3 and V4, this means that some conversion error has occurred in detecting the three higher-order bits. Then, in an interpolation-type A/D conversion circuit, extrapolation ranges between the reference voltages V2 and V3, and V4 and V5 are provided as conversion ranges for correction in addition to the interpolation range between the reference voltage V3 and V4 in the interpolation circuit, so that, when an error has occurred in a higher-order A/D conversion, the error can be corrected by a lower-order A/D conversion circuit.

Such a proposal is described in, for example, Japanese Patent Application Laid-open (Kokai) No. H04-259372

(published on Sep. 29, 1992) and Japanese Patent Application Laid-open (Kokai) No. H04-303537 (published on Nov. 13, 1992). In the A/D conversion circuit proposed in the former application, four (4) differential amplifiers are added in addition to a pair of differential amplifiers. Then, the outputs of those amplifiers are connected to an interpolation circuit consisting of a circuit network and an extrapolation circuit, and an interpolation differential voltage generated by the interpolation circuit and an extrapolation differential voltage generated by the extrapolation circuit are input into a lower-order comparator. Therefore, three higher-order LSB can be corrected. That is, by generating extrapolation differential voltages outside a range between differential voltages (VIN-V3)×m and (VIN-V4)×m in addition to interpolation differential voltages between the differential voltages (VIN-V3)×m and (VIN-V4)×m using the two (2) lower-order bits shown in FIG. 2, higher-order bits can be corrected. However, this A/D conversion circuit needs to be added with the differential amplifiers 5,6 and has a problem that the circuit scale becomes large.

On the other hand, in the A/D conversion circuit proposed in the latter application, it is not necessary to add any differential amplifiers. However, by providing a circuit network between the non-inverted output AP and the inverted output AN of one differential amplifier of the pair of differential amplifiers, and between the non-converted output BP and the inverted output BN of the other differential amplifier, an interpolation voltage and an extrapolation voltage are generated. Therefore, dispersion of the common level of those differential voltages is large and the comparators employing these interpolation differential voltages and extrapolation differential voltages as inputs has a problem that it is necessary to design the range of the guaranteed input common level to be wide.

Furthermore, in the conventional examples described above, a multi-stage configurated interpolation circuit or A/D conversion circuit that further detects lower-order bits after detecting two (2) lower-order bits has not yet been proposed.

SUMMARY OF THE INVENTION

It is therefore an object of the present invention to provide an interpolation circuit with a reduced circuit scale and an A/D conversion circuit utilizing the same.

Another object of the invention is to provide an interpolation circuit that can be constituted in multiple stages and an A/D conversion circuit utilizing the same.

A further object of the invention is to provide an interpolation circuit that can minimize the variation of the common level of the output of the interpolation circuit and an A/D conversion circuit utilizing the same.

In order to achieve the above objects, according to a first aspect of the present invention, an interpolation circuit for generating interpolation differential voltages and extrapolation differential voltages to a first and a second differential input voltages, comprises a first and a second differential amplifiers for inputting the first and the second differential input voltages, respectively, and for generating a differential output voltage of each amplify respectively between inverted output terminal and non-inverted terminal. The interpolation circuit further comprises a first voltage dividing element array disposed between the non-inverted output terminals of the first and the second differential amplifiers, and a second voltage dividing element array disposed between the inverted output terminals of the first and the second differential amplifiers, so that the interpolation differential voltages are generated from nodes in the first voltage dividing element array and nodes in the second voltage dividing element array.

The interpolation circuit further comprises a third voltage dividing element array disposed between the inverted output terminal of the first differential amplifier and the non-inverted output terminal of the second differential amplifier, so that at least a pair of extrapolation differential voltages are generated from nodes in the third voltage dividing element array. Provision of the third voltage dividing element array enables extrapolation differential voltages to be generated such that the interpolation circuit having a correction range can be realized with a reduced circuit scale. Further, an A/D conversion circuit can be obtained by providing the comparator array for inputting the differential output voltages at this interpolation circuit.

In order to attain the above objects, according to a second aspect of the present invention, a pair of voltage dividing element arrays are disposed respectively between the non-inverted output terminal of the first differential amplifier and the inverted output terminal of the second differential amplifier and between the inverted output terminal of the first differential amplifier and the non-inverted output terminal of the second differential amplifier, in addition to the first and the second voltage dividing element arrays, such that at least a pair of extrapolation differential voltages are generated between the nodes of the pair of voltage dividing element arrays.

Further, in order to attain the above objects, according to a third aspect of the present invention, a pair of voltage dividing element arrays are disposed between the nodes in the first and the second voltage dividing element arrays, in addition to the first and the second voltage dividing element arrays, such that at least a pair of extrapolation differential voltages are generated from the nodes in the pair of voltage dividing element arrays and the nodes in the first or the second voltage dividing element array.

To achieve the above objects, according to a fourth aspect of the present invention, in addition to the first and the second voltage dividing element arrays, a pair of voltage dividing element arrays are disposed between the nodes in the first and the second voltage dividing element arrays, and a third voltage dividing element array (NT3) is disposed between the inverted output terminal of the first differential amplifier and the non-inverted output terminal of the second differential amplifier, such that at least a pair of extrapolation differential voltages are generated from the nodes in the third voltage dividing element array and the outputs of the first and the second differential amplifiers.

To achieve the above objects, according to a fifth aspect of the present invention, in addition to the first and the second voltage dividing element array, a pair of voltage dividing element arrays are disposed between the nodes in the first and the second voltage dividing element arrays. A pair of voltage dividing element arrays are further disposed respectively between the non-inverted output terminal of the first differential amplifier and the inverted output terminal of the second differential amplifier, with another dividing element array being disposed between the inverted output terminal of the first differential amplifier and the non-inverted output terminal of the second differential amplifier, such that at least a pair of extrapolation differential voltages are generated between the nodes in those voltage dividing element arrays.

BRIEF DESCRIPTION OF THE DRAWINGS

The above and other objects, aspects, features and advantages of the present invention will become more apparent from the following detailed description when taken in conjunction with the accompanying drawings, in which.

DESCRIPTION OF THE PREFERRED EMBODIMENTS

Exemplary embodiments of the invention will now be described with reference to the accompanying drawings. It is however to be appreciated that the protective scope of the invention is not limited to the following exemplary embodiments but covers the invention defined in the appended claims and equivalents thereof.

First Embodiment

Figure 3:
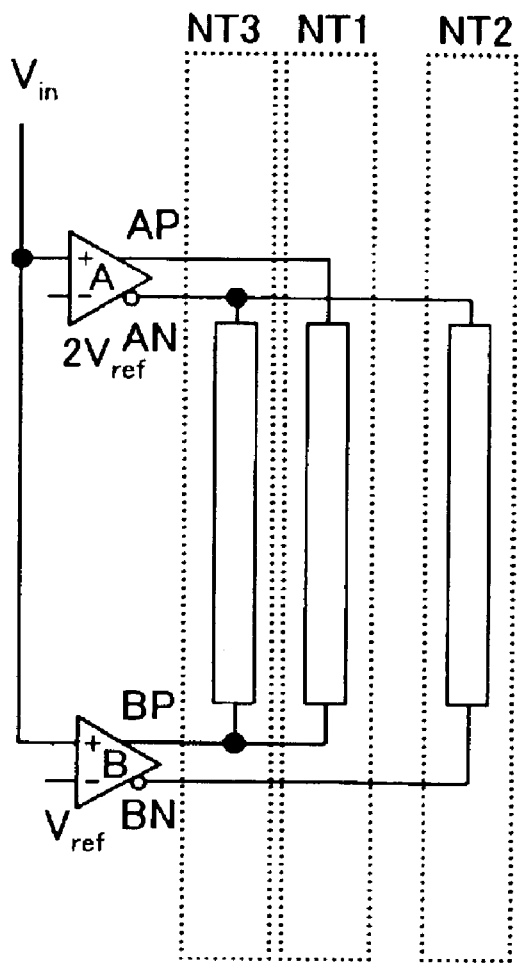
FIG. 3 illustrates the principle of an interpolation circuit according to a first embodiment.
Figure 4:
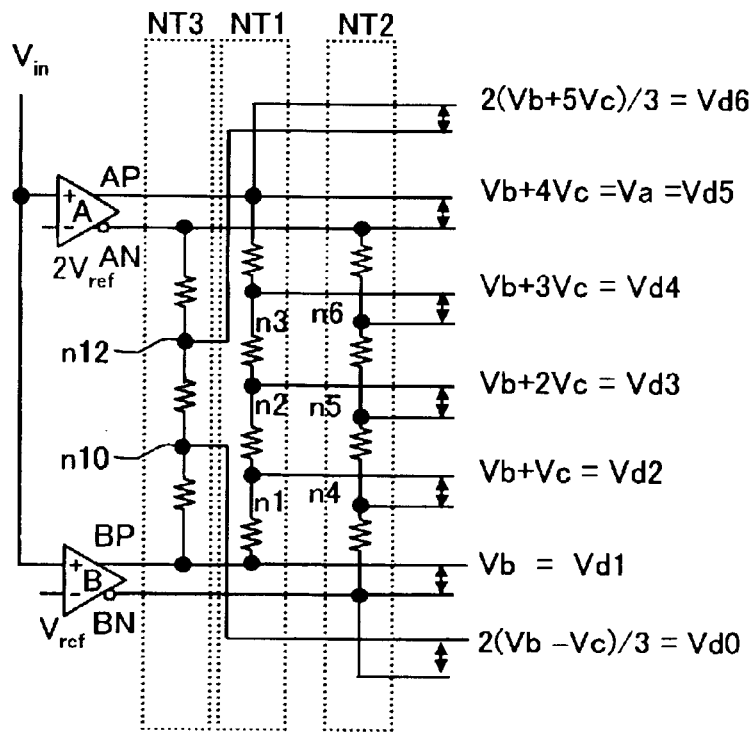
FIG. 4 is a circuit diagram of the interpolation circuit according to the first embodiment.

FIG. 3 illustrates the principle of an interpolation circuit according to a first embodiment and FIG. 4 is a circuit diagram of the interpolation circuit shown in FIG. 3. A pair of differential amplifiers A and B corresponding to the pair of differential amplifiers 5 and 6 for detecting lower-order bits of the A/D conversion circuit shown in FIG. 1 and voltage dividing element arrays NT 1, 2, 3 are shown in FIG. 3 and FIG. 4. The interpolation circuit consists of differential amplifiers A and B, a voltage dividing element array NT3 between an inverted output AN of the differential amplifier A and a non-inverted output BP of the differential amplifier B, a voltage dividing element array NT1 between a non-inverted output AP of the differential amplifier A and the non-inverted output BP of the differential amplifier B and a voltage dividing element array NT2 between the inverted output AN of the differential amplifier A and an inverted output BN of the differential amplifier B.

In the circuit diagram shown in FIG. 4, the voltage dividing element array NT3 consists of three resistor elements having the same resistance R and each of the voltage dividing element arrays NT1 and NT2 consists of four resistor elements having the same resistance R. The voltage dividing element arrays NT1 and NT2 are same as the voltage dividing element arrays 8 and 9 in the interpolation circuit shown in FIG. 1 and interpolation differential voltages Vd1 to Vd5 are generated from combinations of two of interpolation voltages n1 to n6, AP, AN, BP and BN generated at each node of those element arrays.

The voltage dividing element herein includes all elements and circuits that can divide a voltage, such as resistors, transistors and diodes. Hereinafter, the same definition will be applied to other embodiments.

In the example shown in FIGS. 3 and 4, an input voltage Vin and reference voltages Vref and 2Vref are input into the pair of amplifiers A and B having an amplification factor of one (1). A differential output Va (=VAP−VAN) of the first differential amplifier A is Va=Vin−2Vref and a differential output Vb (=VBP−VBN) of the second differential amplifier B is Vb=Vin−Vref. The interpolation differential voltages Vd1 to Vd5 between corresponding nodes of the voltage dividing element arrays NT1 and NT2 are as follows.

$$Vd5=Va=Vb+4Vc=Vin-2Vref:VAP-VAN;$$

$$Vd4=Vb+3Vc=Vin-Vref-3Vref/4:Vn3-Vn6;$$

$$Vd3=Vb+2Vc=Vin-Vref-2Vref/4:Vn2-Vn5;$$

$$Vd2=Vb+Vc=Vin-Vref-Vref/4:Vn1-Vn4; \text{ and}$$

$$Vd1=Vb=Vin-Vref:VBP-VBN;$$

where $$Vc=(Va-Vb)/4=-Vref/4.$$

Furthermore, in the first embodiment, the voltage dividing element array NT3 has the three resistor elements connected in series between the outputs AN and BP and the connection nodes n10 and n12 of the array NT3 generate such extrapolation differential voltages respectively according to the outputs BN and AP of the differential amplifier as $$Vd0=2(Vb-Vc)/3:Vn10-VBN \text{ and}$$

$$Vd6=2(Vb+5Vc)/3:VAP-Vn12.$$

These extrapolation differential voltages Vd0 and Vd6 can be obtained by setting up node equations for the circuit network of the voltage dividing element arrays NT1, NT2 and NT3 and solving those simultaneous equations.

Figure 5:
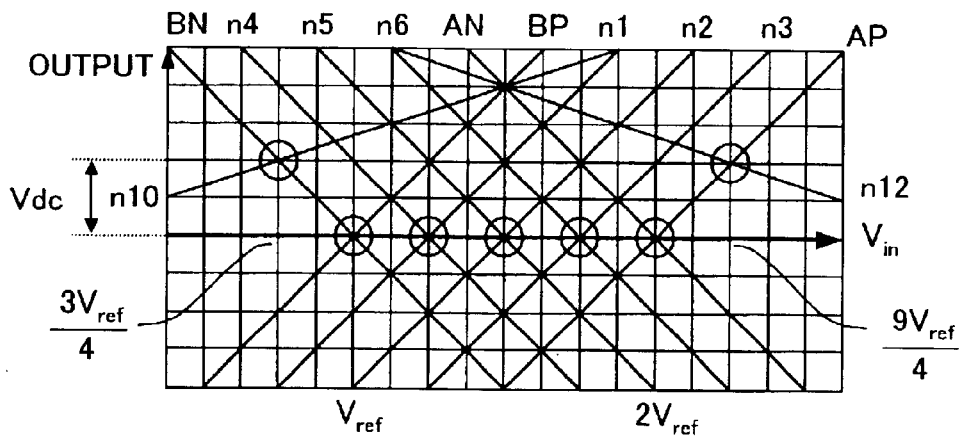
FIG. 5 shows the input/output characteristic of the interpolation circuit of the first embodiment.

FIG. 5 shows the input/output characteristic of the interpolation circuit of the first embodiment. The axis of abscissas in FIG. 5 represents the input voltage Vin and the axis of ordinate represents the output of the interpolation circuit. The variation of the voltages at the nodes AP, AN, BP, BN, n1 to n6, n10 and n12 are respectively represented by straight lines lAP, lAN, lBP, lBN, ln1 to ln6, ln10 and ln12. This characteristic chart is the characteristic chart of the circuit network shown in FIG. 4. Therefore, for example, the interpolation differential voltage Vd1=Vb is the voltage difference between the voltage VBP at the node BP and the voltage VBN at the node BN and, when the input voltage Vin equals to Vref, its interpolation differential voltage Vd1 equals Vb=0. Therefore, the polarity of the interpolation differential voltage Vd1=Vb is inverted at its zero-crossing point. Similarly, the interpolation differential voltage Vd5= Va is the voltage difference between the voltages VAP and VAN and, when the input voltage Vin equals to 2Vref, its interpolation differential voltage Vd5 equals Va=0. Therefore, the polarity of the interpolation differential voltage Vd5=Va is inverted at its zero-crossing point. Yet similarly, the interpolation voltage Vd2=Vb+Vc between the voltage Vn1 at the node n1 and the voltage Vn4 at the node n4 becomes zero when Vin=5vref/4. The interpolation voltage Vd3=Vb+2Vc between the voltage Vn2 at the node n2 and the voltage Vn5 at the node n5 becomes zero when Vin=6Vref/4. The interpolation voltage Vd4=Vb+3Vc between the voltage Vn3 at the node n3 and the voltage Vn6 at the node n6 becomes zero when Vin=7Vref/4. That is, the points indicated by five circles along the axis of abscissas representing Vin in FIG. 5 are the above zero-crossing points of the interpolation differential voltage.

Furthermore, in the first embodiment, the voltage dividing element array NT3 is added and the extrapolation differential voltages Vd0=2 (Vb−Vc)/3 and Vd6=2 (Vb+5Vc)/3 are generated. The one extrapolation differential voltage Vd0= 2(Vb−Vc)/3 becomes zero when Vin=3Vref/4 and its polarity is inverted at Vin=3Vref/4. The other extrapolation differential voltage Vd6=2(Vb+5Vc)/3 becomes zero when Vin=9Vref/4 and its polarity is inverted at Vin=9Vref/4. The voltage at the nodes n10 and n12 of the element array NT3 for generating these extrapolation differential voltages are shown by straight lines ln10 and ln12 in FIG. 5. Since the element array NT3 divides equally into three the voltage between VAN and VBP, the straight lines ln10 and ln12 are the straight lines dividing equally into three (3) the crossing angle formed by straight lines lAN and lBP. The zero-crossing points of the extrapolation differential voltages described above are indicated by circles at the left and right ends.

The input voltages Vin crossing zero in FIG. 5 are all spaced by Vc=Vref/4 and the positions of the zero-crossing points for interpolation and extrapolation are equally spaced to the input voltages Vin. Then, three interpolation points are added between Vin=Vref and Vin=2Vref. Furthermore, an extrapolation point lower than the Vin=Vref and an extrapolation point higher than Vin=2Vref are added forming a correction region.

As described above, in the interpolation circuit shown in FIG. 4, by only providing the element array NT3 between the node AN and BP in addition to the conventional voltage dividing element arrays NT1 and NT2, the extrapolation differential voltages on both ends can be generated and the correction of higher-order bits can be conducted utilizing those extrapolation differential voltages. As apparent from FIG. 4 and FIG. 5, the element array NT3 for generating the extrapolation voltages may be provided between the nodes AP and BN. In this case, the straight lines ln10 and ln12 for the node n10 and n12 are positioned on the lower side of the axis of abscissas symmetrically for the axis of abscissas and the zero-crossing points of the extrapolation differential voltages are also positioned in the lower side of the axis of abscissas symmetrically for the axis of abscissas.

Figure 6:
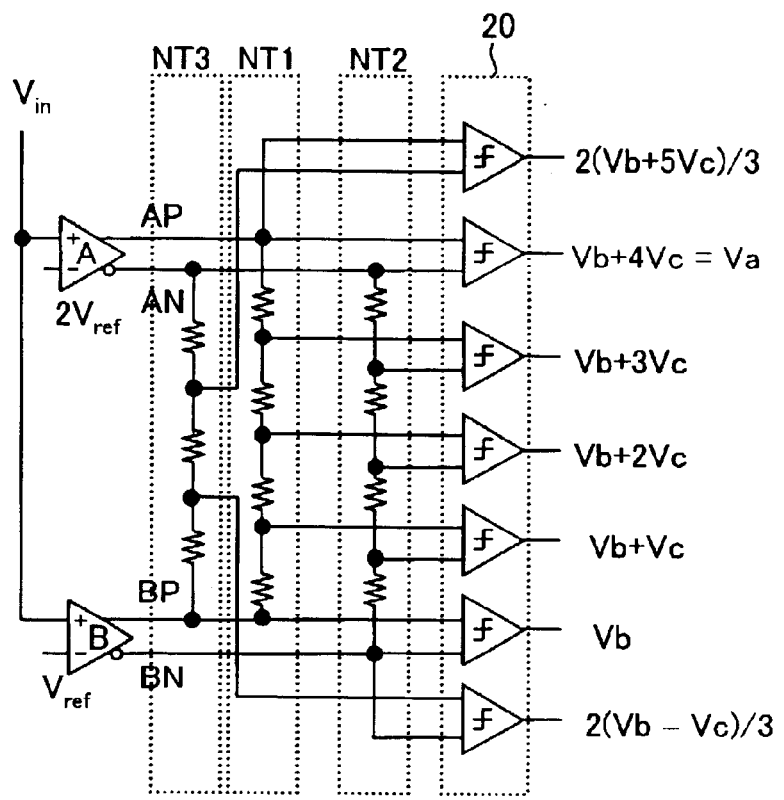
FIG. 6 is a circuit diagram of an A/D conversion circuit utilizing the interpolation circuit shown in FIG. 4.

FIG. 6 is a circuit diagram of an A/D conversion circuit utilizing the interpolation circuit shown in FIG. 4. This A/D conversion circuit is constituted by, in addition to the interpolation circuit shown in FIG. 4, adding a comparator array 20 to be supplied with seven pairs of differential output voltages. The conversion error in higher-order bits can be corrected by using this comparator array 20 having a correction range. Differential input voltage of each of the comparator is shown at the output side of the comparator array 20 shown in FIG. 6.

As shown in the input/output characteristic chart of the interpolation circuit shown in FIG. 5, the level of common voltage Vcom (the level on the direction of the axis of ordinate for zero-crossing points) for the interpolation differential voltage is same. Therefore, the comparator for inputting the interpolation differential voltage can be a narrow range of the input common level to be guaranteed. However, the common voltage Vcom of the extrapolation differential voltages (Vn10-VBN and VAP-Vn12) is displaced by Vdc from the common voltage of the interpolation differential voltage as shown in FIG. 5. Therefore, the comparator for inputting the extrapolation differential voltage is needed to widen by the amount of the difference Vdc the range of the input common level to be guaranteed.

Second Embodiment

Figure 1:
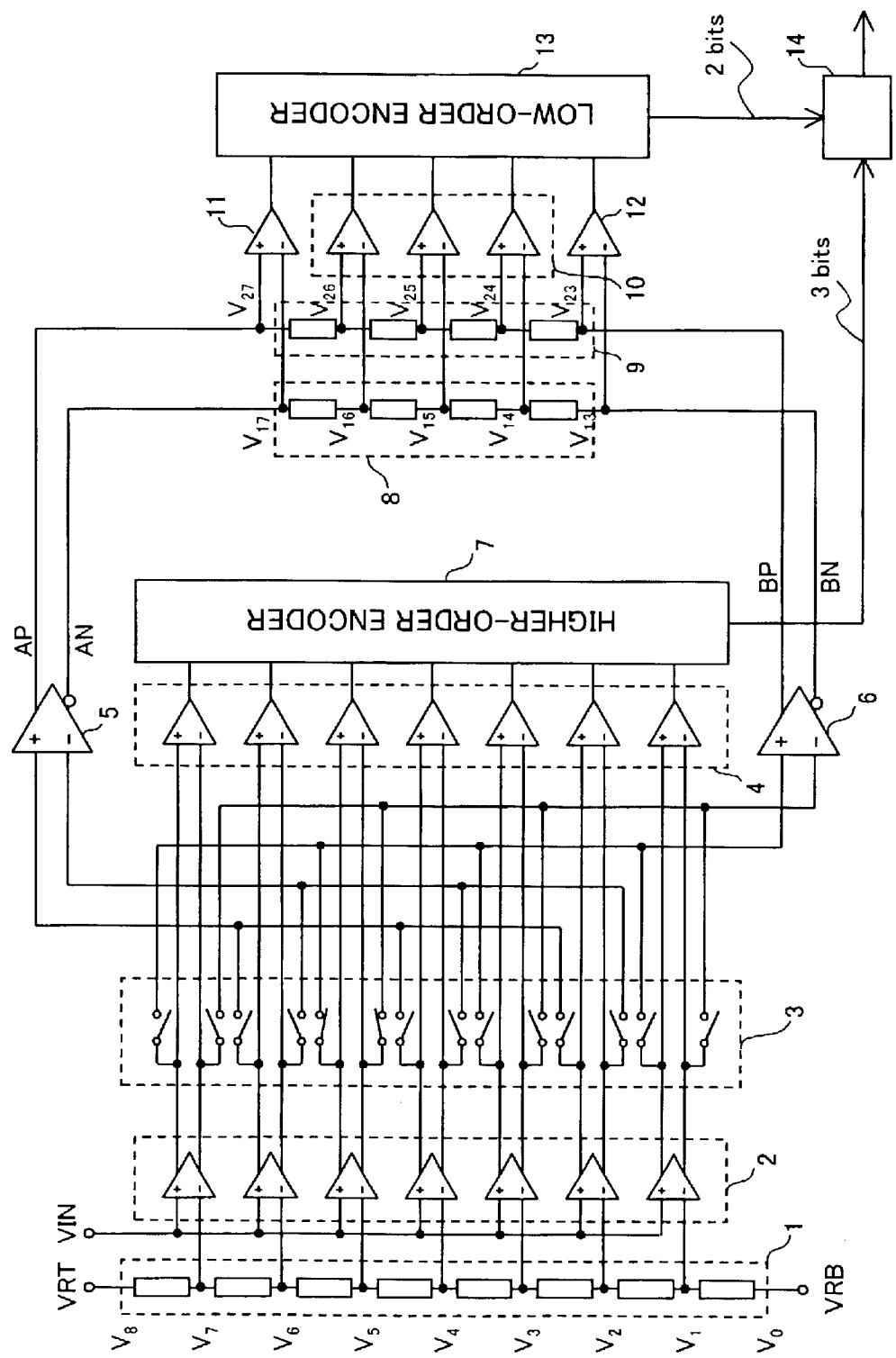
FIG. 1 is a circuit diagram illustrating a conventional interpolation-type A/D conversion circuit.
Figure 7:
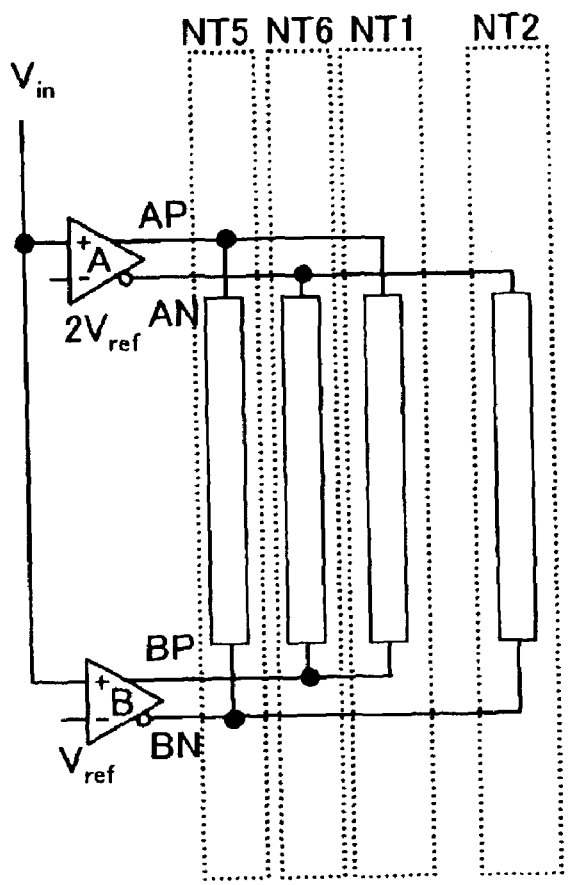
FIG. 7 illustrates the principle of the interpolation circuit according to a second embodiment.
Figure 8:
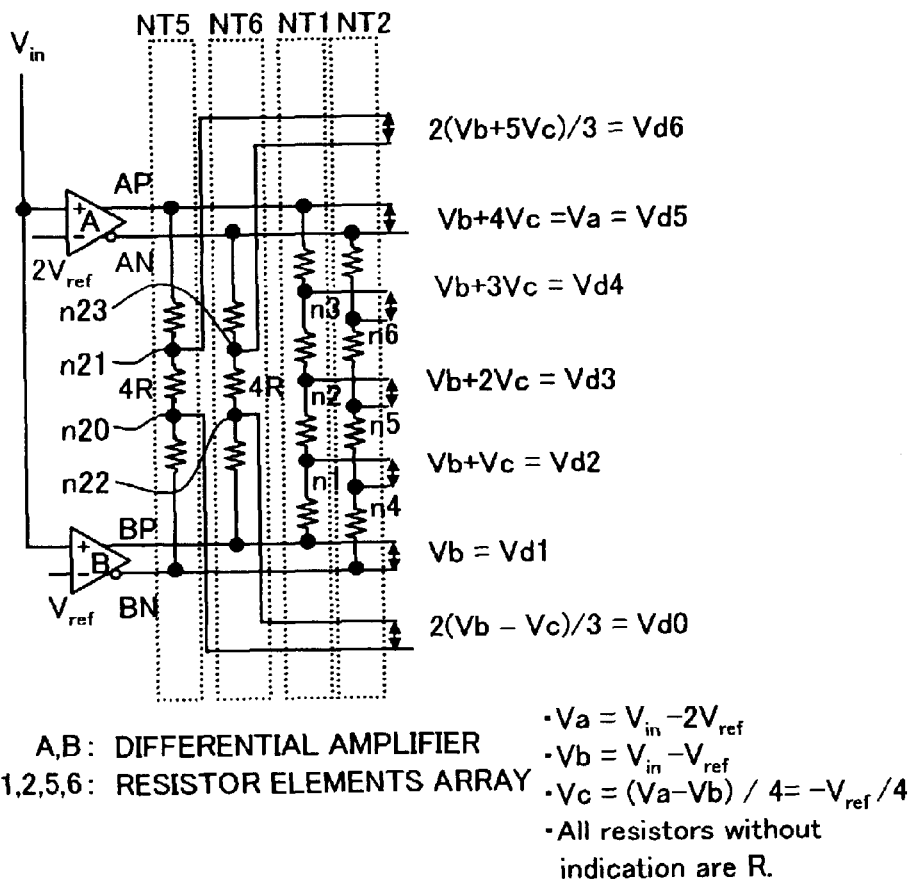
FIG. 8 is a circuit diagram of the interpolation circuit according to the second embodiment.

FIG. 7 illustrates the principle of the interpolation circuit according to a second embodiment. FIG. 8 is a circuit diagram of the interpolation circuit according to the second embodiment shown in FIG. 7. Same as in FIG. 7 and FIG. 8, a pair of differential amplifiers A and B corresponding to the pair of differential amplifiers 5 and 6 and the voltage dividing element arrays for detecting lower-order bits, presented in the A/D conversion circuit shown in FIG. 1, are presented. In addition to the differential amplifiers A and B, and the voltage dividing element arrays NT1 and NT2 of the first embodiment, this interpolation circuit has a voltage dividing element array NT5 between the non-inverted output AP of the differential amplifier A and the inverted output BN of the differential amplifier B, and a voltage dividing element array NT6 between the inverted output AN of the differential amplifier A and the non-inverted output BP of the differential amplifier B.

As shown in FIG. 8, in the second embodiment, the voltage dividing element arrays NT1 and NT2 for generating the interpolation differential voltages have same resistive elements having the same resistance R as presented in the first embodiment, while the resistance of voltage dividing elements in both of the voltage dividing element arrays NT5 and NT6 for generating the interpolation differential voltages are set at R, 4R and R. Then, one extrapolation differential voltage Vd0 is generated by the voltage difference between those at nodes n20 and n22 and the other extrapolation differential voltage Vd6 is generated by the voltage difference between those at nodes n21 and n23. By setting the resistance at these values, the two extrapolation differential voltages Vd0 and Vd6 become respectively 2(Vb−Vc)/3 and 2(Vb+5Vc)/3 similarly to that of the first embodiment and, according to this, the zero-crossing points of these extrapolation differential voltages equal Vin=

3Vref/4 and Vin=9Vref/4. These extrapolation differential voltages can also be obtained by setting up and solving the node equations for the circuit network.

Figure 9:
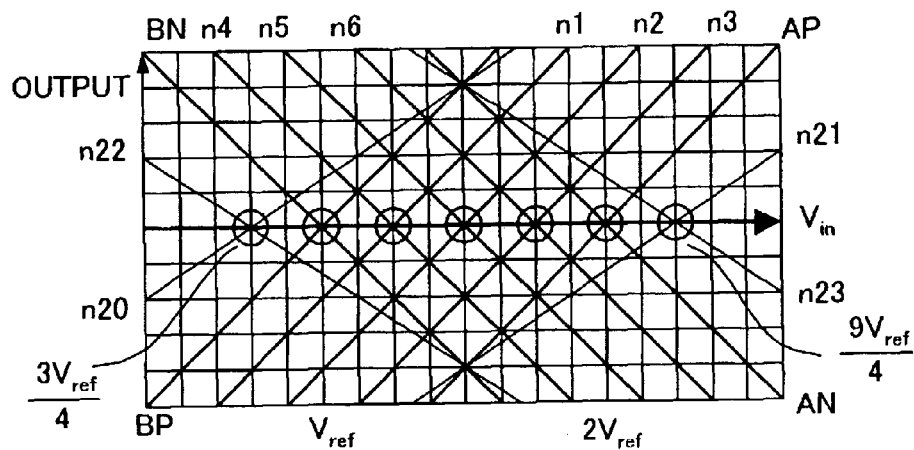
FIG. 9 is an input/output characteristic chart of the interpolation circuit according to the second embodiment.

FIG. 9 shows an input/output characteristic chart of the interpolation circuit shown in FIG. 8. By setting at R, 4R and R the resistances of the resistive elements in each of the element arrays NT5 and NT6, straight lines ln20 and ln22 respectively of the node n20 and n22 cross each other on the axis of abscissas Vin and, similarly, straight lines ln21 and ln23 respectively of the node n21 and n23 cross each other on the axis of abscissas Vin. As a result, the zero-crossing points (Vin=3Vref/4 and 9Vref/4) of the extrapolation differential voltages line up at the same level (the level on the axis of ordinate) as the zero-crossing points of the interpolation differential voltages. Therefore, the common levels of these differential voltages all coincide with each other.

Figure 10:
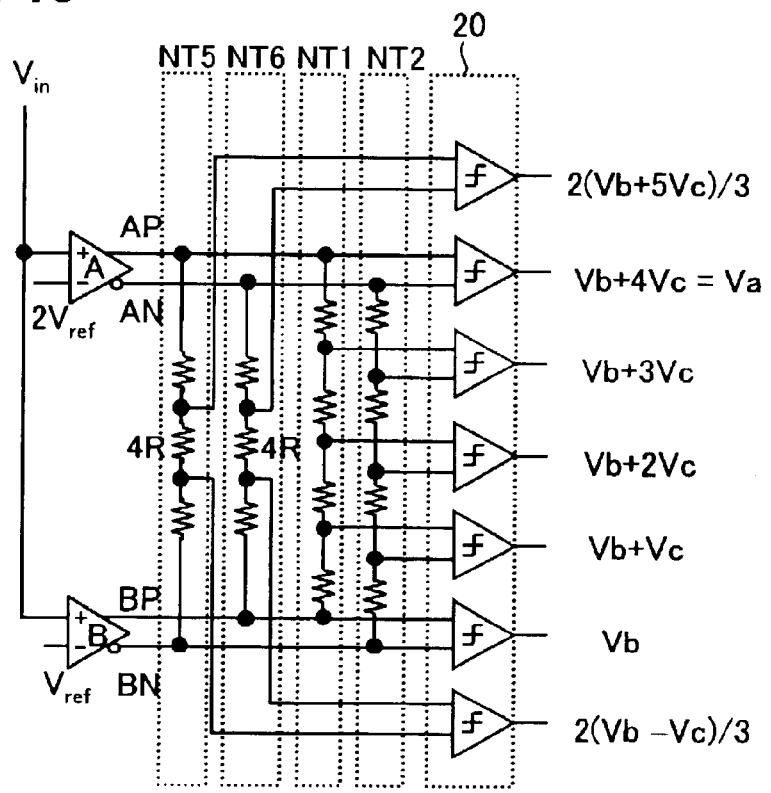
FIG. 10 is a circuit diagram of an A/D conversion circuit utilizing the interpolation circuit shown in FIG. 8.

FIG. 10 is a circuit diagram of an A/D conversion circuit utilizing the interpolation circuit shown in FIG. 8. Same as in FIG. 6, the comparator array 20 to be supplied with respectively the interpolation differential voltage and the extrapolation differential voltage is added to the interpolation circuit. Therefore, by using the comparator array 20 having a correction range, error of not only the conversion of lower-order bits but also the conversion of higher-order bits can be corrected. Furthermore, since the common levels of the differential input voltages for the comparator arrays 20 are all equal as shown in FIG. 9 and the range of the input common levels to be guaranteed by the comparators can be narrowed, the design of the comparators can be more simplified.

As described above, in the second embodiment, the extrapolation differential output voltages can be generated only by providing the voltage dividing element arrays NT5 and NT6 respectively between the non-inverted output AP of the differential amplifier A and the inverted output BN of the differential amplifier B and between the inverted output AN and non-inverted output BP, in addition to the voltage dividing element arrays of the interpolation circuit shown in FIG. 1. Furthermore, in the second embodiment, the common levels of the interpolation differential voltage and the extrapolation differential voltage can be equalized and, therefore, the circuit design of the comparators into which those differential voltages are input can be more simplified.

Third Embodiment

Figure 11:
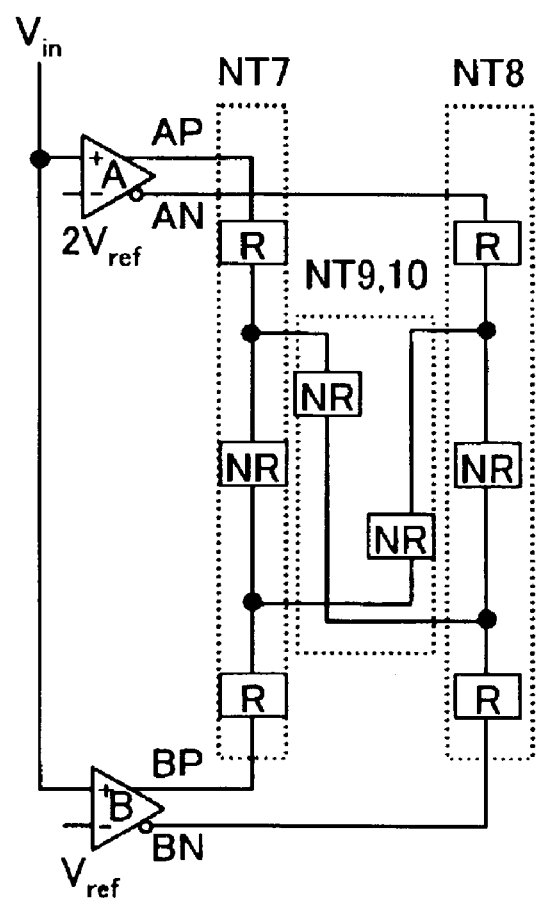
FIG. 11 illustrates the principle of the interpolation circuit according to the third embodiment.
Figure 12:
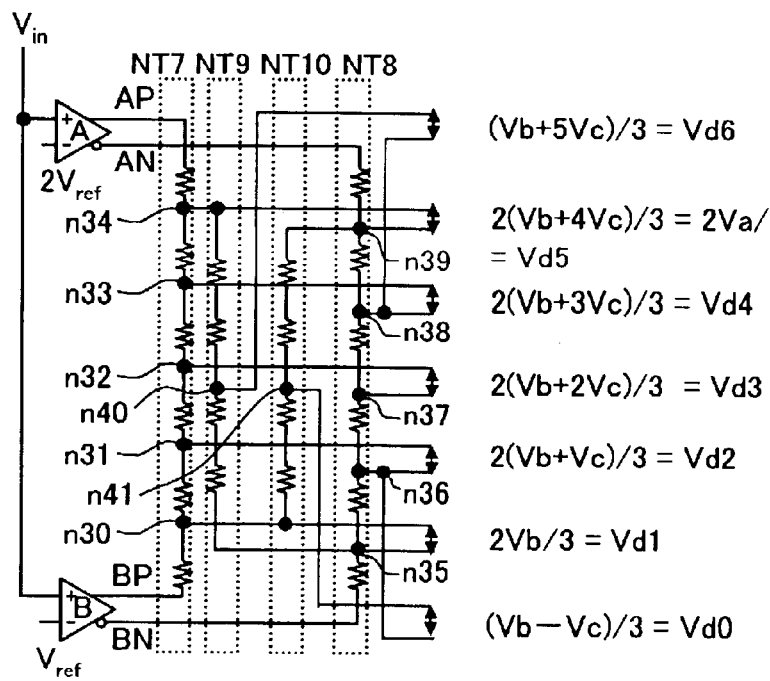
FIG. 12 is a circuit diagram of the interpolation circuit according to the third embodiment.

FIG. 11 illustrates the principle of the interpolation circuit according to the third embodiment and FIG. 12 is a circuit diagram of the interpolation circuit shown in FIG. 11. In addition to the differential amplifiers A and B, the interpolation circuit according to the third embodiment has a voltage dividing element array NT7 between the non-inverted output AP of the differential amplifier A and the non-inverted output BP of the differential amplifier B, a voltage dividing element array NT8 between the inverted output AN of the differential amplifier A and the inverted output BN of the differential amplifier B, and voltage dividing element arrays NT9 and NT10 connecting the intermediate nodes of the element arrays NT7 and NT8.

When interpolating equally into N, voltage dividing elements having resistances of R, NR (N×R) and R are connected in series in each of the voltage dividing element arrays NT7 and NT8 for generating the interpolation differential voltages, and voltage dividing elements having a resistance of NR are connected in series in the voltage dividing element arrays NT9 and NT10. In the interpolation circuit shown in FIG. 12 when it is assumed that N=4, the interpolation differential voltages Vd1 to Vd5 are generated from each voltage difference respectively between the voltages at nodes n30 to n34 in the element array NT7 and nodes n35 to n39 in the element array NT8. Furthermore, assuming that the resistance of each resistive element in the voltage dividing element arrays NT9 and NT10 to be 4R, the extrapolation differential voltages Vd0 and Vd6 are generated from each voltage difference respectively between those at the intermediate nodes n40 and n41 of those arrays NT9 and NT10 and nodes n38 and n36.

As shown in FIG. 12, the interpolation differential voltages Vd1 to Vd5 described above are:

$2(Vb+4Vc)/3=2(Vin-2Vref)/3:Vn34-Vn39$;

$2(Vb+3Vc)/3=2(Vin-Vref-3Vref/4)/3:Vn33-Vn38$;

$2(Vb+2Vc)/3=2(Vin-Vref-2Vref/4)/3:Vn32-Vn37$;

$2(Vb+Vc)/3=2(Vin-Vref-Vref/4)/3:Vn31-Vn36$; and $2Vb/3=2(Vin-Vref)/3:Vn30-Vn35$.

By setting at R, 4R (or NR) and R the resistances of the resistive elements in the resistive element array, the interpolation differential voltages Vd1 to Vd5 are $2/3$ (or $N/(N+2)$) (times) of the interpolation differential voltage in the first and second embodiments.

As shown in FIG. 12, the interpolation differential voltages Vd0 and Vd6 are:

$Vd6=(Vb+5Vc)/3=(Vin-5Vref/4)/3:Vn40-Vn38$ and $Vd0=(Vb-Vc)/3=(Vin-3Vref/4)/3:Vn41-Vn36$.

Figure 13:
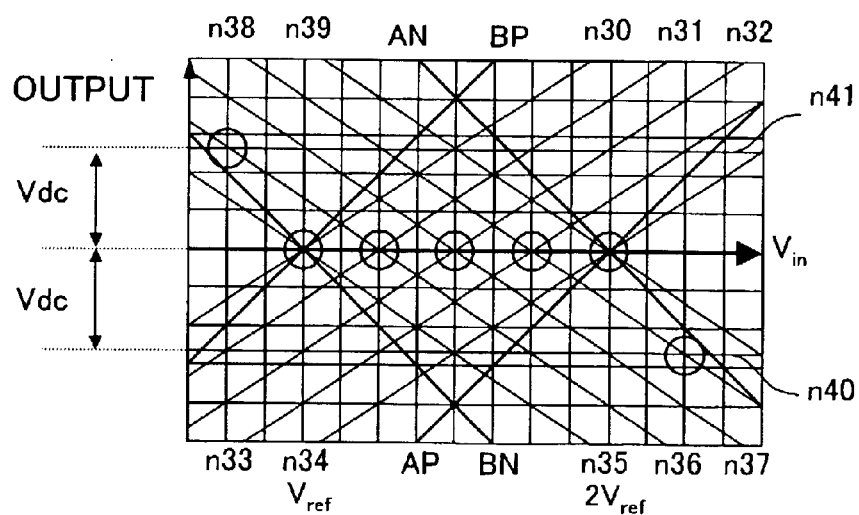
FIG. 13 is an input/output characteristic chart of the interpolation circuit according to the third embodiment.

FIG. 13 is an input/output characteristic chart of the interpolation circuit according to the third embodiment and voltage variations of the nodes n30 to n39, n40 and n41 are shown by corresponding straight lines. Since the node n40 is the midpoint of the voltage dividing element array NT9 connecting the node n34 and n35, the input/output characteristic ln40 of the node n40 is a straight line extending in the center of the crossing angle formed by the straight lines ln34 and ln35 respectively of the nodes n34 and n35. On the other hand, the characteristic of the node n41 is a straight line extending in the center of the crossing angle formed by the straight lines ln30 and ln39 respectively of the nodes n30 and n39 for the same reason. Therefore, the zero-crossing points of the extrapolation differential voltages Vd0 and Vd6 on both ends are the circles on both sides shown in FIG. 13. On the other hand, the five (5) zero-crossing points of the interpolation differential voltages line up equally spaced on the axis of abscissas Vin similarly in the above described embodiment.

As apparent from FIG. 12 and FIG. 13, the extrapolation differential output voltage Vd0 can also be generated from the voltages Vn40 and Vn31 respectively of the nodes n40 and n31 and the extrapolation differential output voltage Vd6 can also be generated from the voltages Vn41 and Vn33.

As described above, the interpolation circuit according to the third embodiment can be realized only by providing the voltage dividing element arrays NT7 to NT10.

Figure 14:
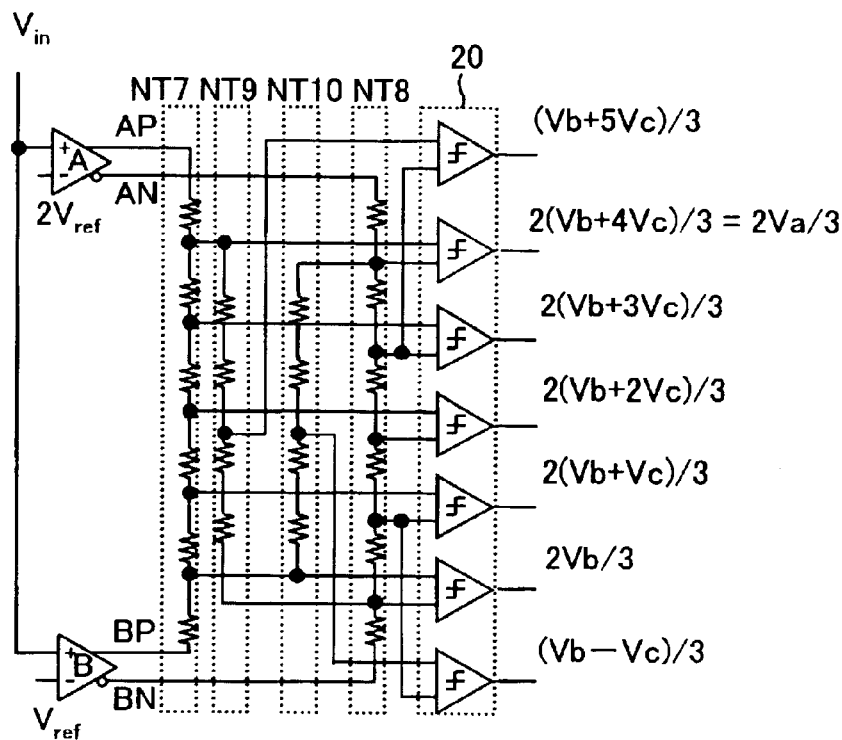
FIG. 14 is a circuit diagram of an A/D conversion circuit utilizing the interpolation circuit shown in FIG. 12.

FIG. 14 is a circuit diagram of an A/D conversion circuit utilizing the interpolation circuit shown in FIG. 12. To the interpolation circuit shown in FIG. 12, the comparator array 20 for inputting the differential output voltages of the interpolation circuit is added. As apparent from a characteristic chart shown in FIG. 13, the common levels of the interpolation differential voltages are equal, however, the common levels of the extrapolation differential voltages have a potential difference Vdc similarly to the first embodiment. Therefore, it is necessary to widen by the amount of the potential difference the range of the common levels of the extrapolation differential voltages to be guaranteed by the comparators.

Fourth Embodiment

Figure 15:
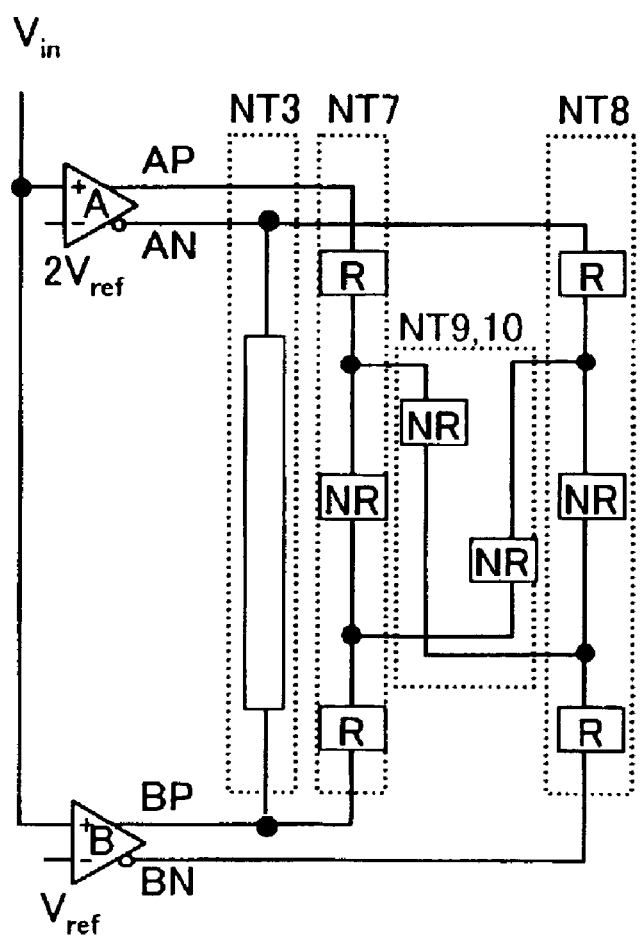
FIG. 15 illustrates the principle of an interpolation circuit according to a fourth embodiment.
Figure 16:
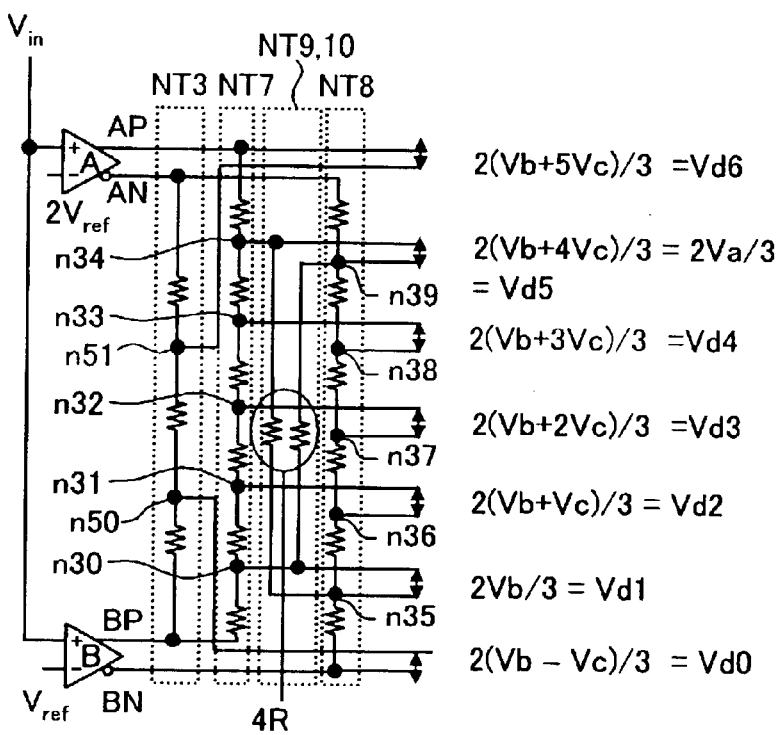
FIG. 16 is the circuit diagram of the interpolation circuit according to the fourth embodiment.

FIG. 15 illustrates the principle of an interpolation circuit according to a fourth embodiment and FIG. 16 is the circuit diagram of the interpolation circuit shown in FIG. 15. In addition to the differential amplifiers A and B, the interpolation circuit according to the fourth embodiment has the voltage dividing element array NT7 between the non-inverted output AP of the differential amplifier A and the non-inverted output BP of the differential amplifier B, the voltage dividing element array NT8 between the inverted output AN of the differential amplifier A and the inverted output BN of the differential amplifier B, and the voltage dividing element arrays NT9 and NT10 connecting the intermediate nodes of the element arrays NT7 and NT8. As for the above, the configuration is same as that of the third embodiment.

Furthermore, the interpolation circuit according to the fourth embodiment has the voltage dividing element array NT3 between the inverted output AN of the differential amplifier A and the non-inverted output BP of the differential amplifier B. Since this voltage dividing element array NT3 is constituted by the same principle with the same objective as the element array NT3 shown in FIG. 4, this voltage dividing element array NT3 can be provided between the non-inverted output AP of the differential amplifier A and the inverted output BN of the differential amplifier B in stead of the element array NT3 between AN and BP.

Then, when interpolating equally into N, voltage dividing elements having resistances of R, NR and R are connected in series in the voltage dividing element arrays NT7 and NT8 and a voltage dividing element having a resistance of NR is further connected in series in the voltage dividing element arrays NT9 and NT10. In the interpolation circuit shown in FIG. 16 when N equals four, the interpolation differential voltages Vd1 to Vd5 are generated from each respective potential difference between the voltages at nodes n30 to n34 in the element array NT7 and the voltages at nodes n35 to n39 in the element array NT8. Since this configuration for generating the interpolation differential voltages is same as that of the third embodiment, those interpolation differential voltages are equal to that of the third embodiment as shown in FIG. 16.

Furthermore, similarly to the first embodiment, in the interpolation circuit in the fourth embodiment, the voltage dividing element array NT3 is constituted by three resistive elements having the same resistance R, one extrapolation differential voltage Vd0=2(Vb−Vc)/3 is generated from the potential difference between those at the node n50 in the element array NT3 and the inverted output BN and the other extrapolation differential voltage Vd6=2(Vb+5Vc)/3 is generated from the potential difference between those at the node n51 and the non-inverted output AP.

Figure 17:
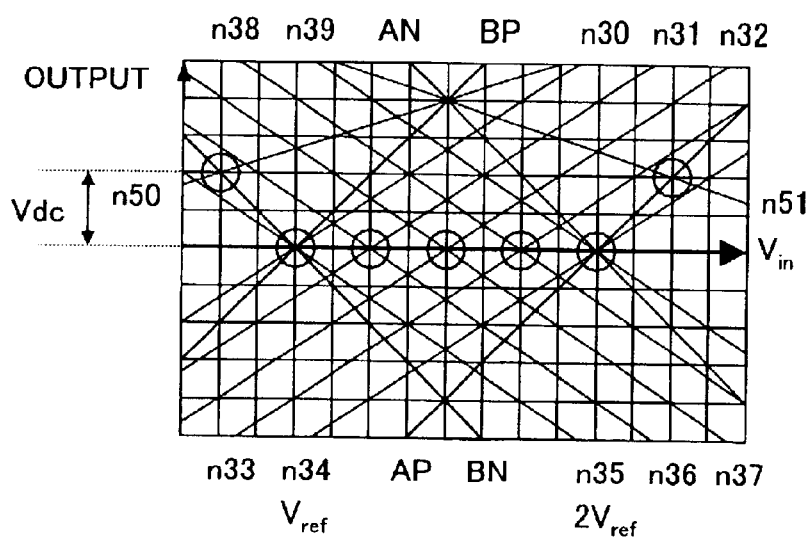
FIG. 17 is an input/output characteristic chart of the interpolation circuit according to the fourth embodiment.

FIG. 17 is an input/output characteristic chart of the interpolation circuit in the fourth embodiment. Straight lines ln30 to ln39 respectively for the nodes n30 to n39 are same as those in FIG. 13. Therefore, the positions of five zero-crossing points of the interpolation differential voltages are same as those shown in FIG. 13. The voltage dividing element array NT3 is same as the voltage dividing element array NT3 shown in FIG. 6 and the extrapolation differential voltages Vd0 and Vd6 generated by the potential differences between those respectively at the node n50 and n51 in the element array and the output AN and the output BP are same as those shown in FIG. 6. Therefore, similarly to FIG. 5, the straight lines ln50 and ln51 are the straight lines dividing equally into three the crossing angle formed by the straight lines lBP and lAN.

In the interpolation circuit in the fourth embodiment, the interpolation differential voltages Vd1 to Vd5 are ⅔ times as large those of the first embodiment (FIG. 6) and the second embodiment (FIG. 10) due to the element arrays NT7 and NT8. Furthermore, the extrapolation differential voltages Vd0 and Vd6 are equal to those of the first embodiment (FIG. 6) and the second embodiment (FIG. 10). As a result, all the differential voltages Vd0 to Vd6 increase by 2Vref/3 one after another from Vd0 to Vd6. Such interpolation circuit that can set the differential output voltages being equally spaced can be utilized for not only A/D conversion circuits but also A/D conversion circuits connected in multiple stages, it is possible to constitute A/D conversion circuits that can detect further lower-order bits. Since the spacing of the potential difference between the extrapolation differential voltages and extrapolation differential voltages is different in the first to third embodiments, those embodiments are not suitable for such a multi-stage configuration.

Figure 2:
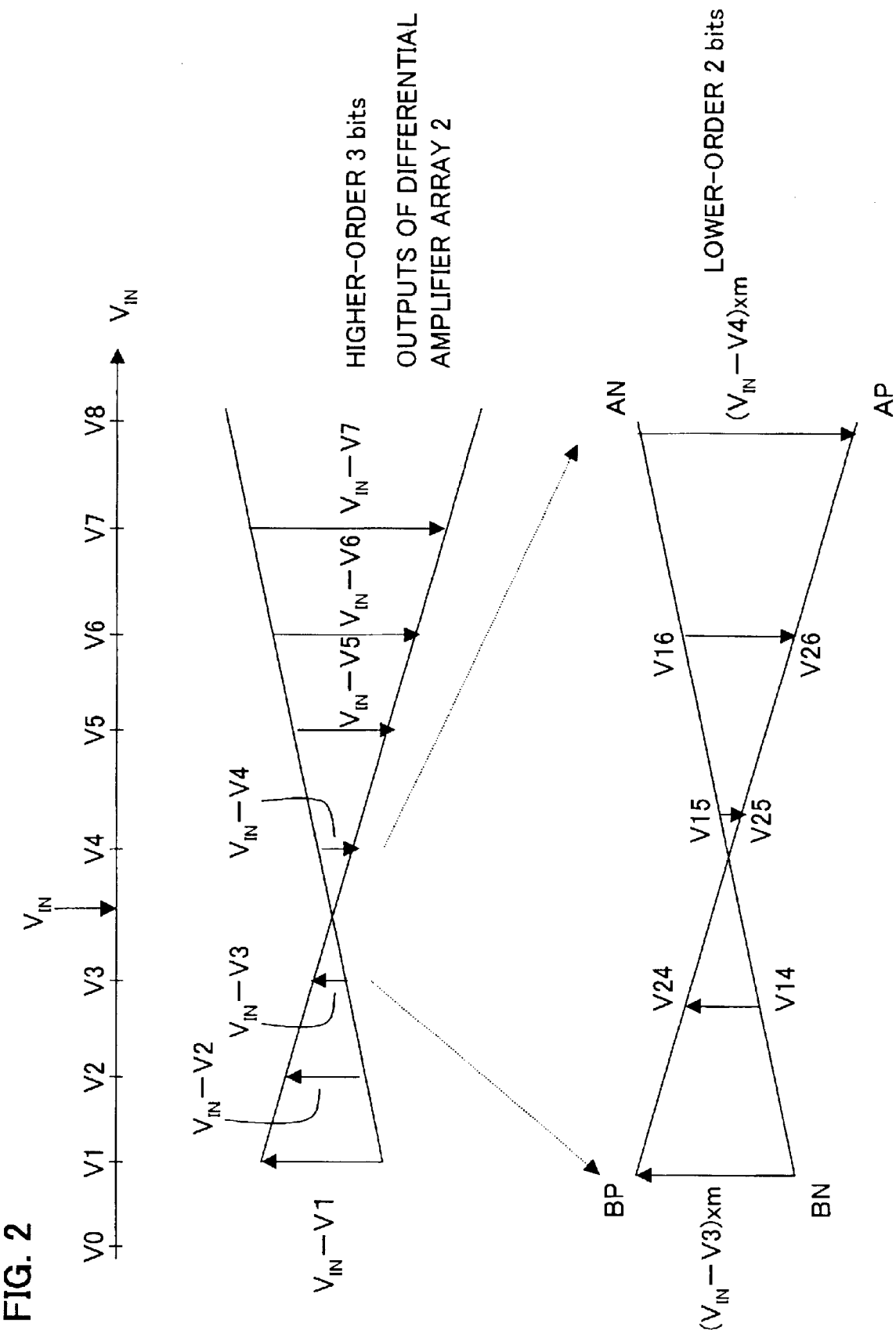
FIG. 2 illustrates the principle of the operation of the A/D converter shown in FIG. 1.

The multi-stage configuration can be understood by referring to FIG. 2. FIG. 2 shows the principles of the A/D conversion circuit for the three higher-order bits and the conversion circuit for the two lower-order bits. In FIG. 2, the voltages V0 to V8 are all equally spaced and the potential differences of VIN-V1 to VIN-V7 of the three higher-order bits are all equally spaced. Only the interpolation differential voltages are shown in FIG. 2. However, the A/D conversion circuit consisting of the interpolation circuit and the comparators can be constituted in a multi-stage configuration when the spacing of the potential differences of the extrapolation differential voltages can be made same as the spacing of the potential differences of the interpolation differential voltages.

Figure 18:
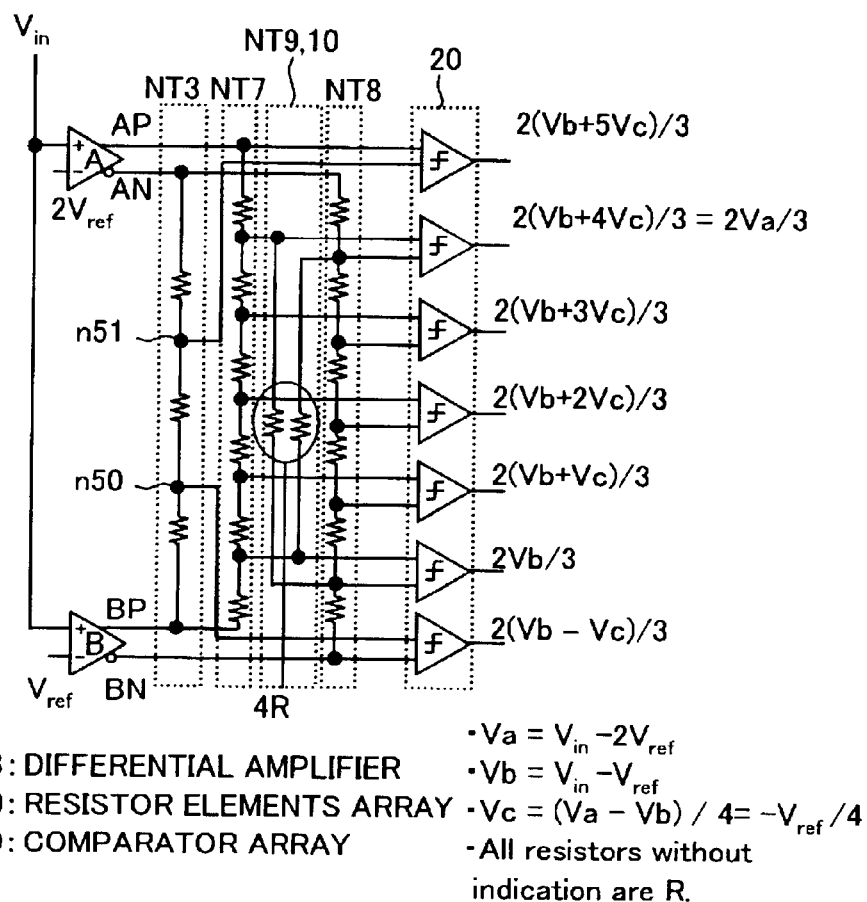
FIG. 18 is a circuit diagram of an A/D conversion circuit utilizing the interpolation circuit shown in FIG. 16.

FIG. 18 is a circuit diagram of an A/D conversion circuit utilizing the interpolation circuit shown in FIG. 16. The comparator array 20 for inputting respectively the interpolation differential voltages and extrapolation differential voltages is added to the circuit shown in FIG. 16. As apparent from the characteristic chart shown in FIG. 17, the common levels of the interpolation differential voltages are equal to each other, however, the common levels of the extrapolation differential voltages have the potential difference Vdc similarly to the first embodiment. However, since adjacent potential differences of the differential output voltages are all unified to 2Vref/3 in this A/D conversion circuit, it is possible to arrange the A/D conversion circuit shown in FIG. 18 into a multi-stage configuration and utilize it as an A/D conversion circuit that can detect further lower-order bits.

Figure 19:
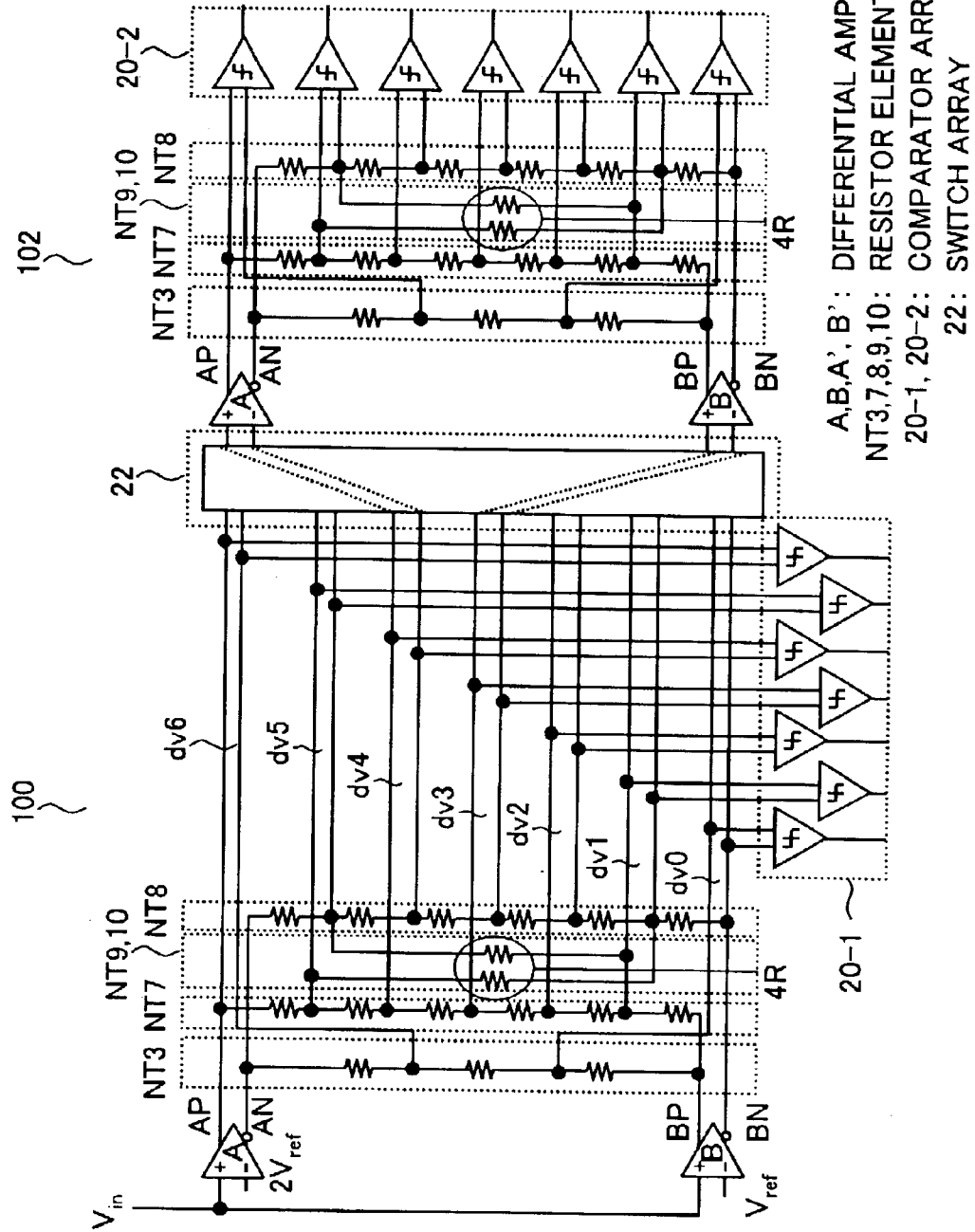
FIG. 19 is a circuit diagram of an A/D conversion circuit of two stage configurated the A/D conversion circuit shown in FIG. 18.

FIG. 19 is a circuit diagram of an A/D conversion circuit constituted by constituting the A/D conversion circuit shown in FIG. 18 into a two-stage configuration. An A/D conversion circuit 100 in the first stage is same as the one shown in FIG. 18. Therefore, the interpolation differential voltages Vd1 to Vd5 and the extrapolation differential voltages Vd0 and Vd6 are input into a comparator array 20-1. An A/D conversion circuit 102 in the second stage is constituted similarly to the one shown in FIG. 18 and the differential voltages are supplied to a comparator array 20-2. Then, adjacent interpolation differential voltages or extrapolation differential voltages (two adjacent differential voltages from Vd0 to Vd6) selected according to an output of an encoder not shown connected to the output of the comparator array 20-1 in the first stage or the output of the comparator array 20-1 are supplied to the differential amplifiers A and B of the A/D conversion circuit 102 in the second stage through a switch array 22. The wiring of the switch array 22 shown in the figure is an exemplary wiring. It is possible to further connect an A/D conversion circuit in the stage following the A/D conversion circuit in the second stage.

Figure 20:
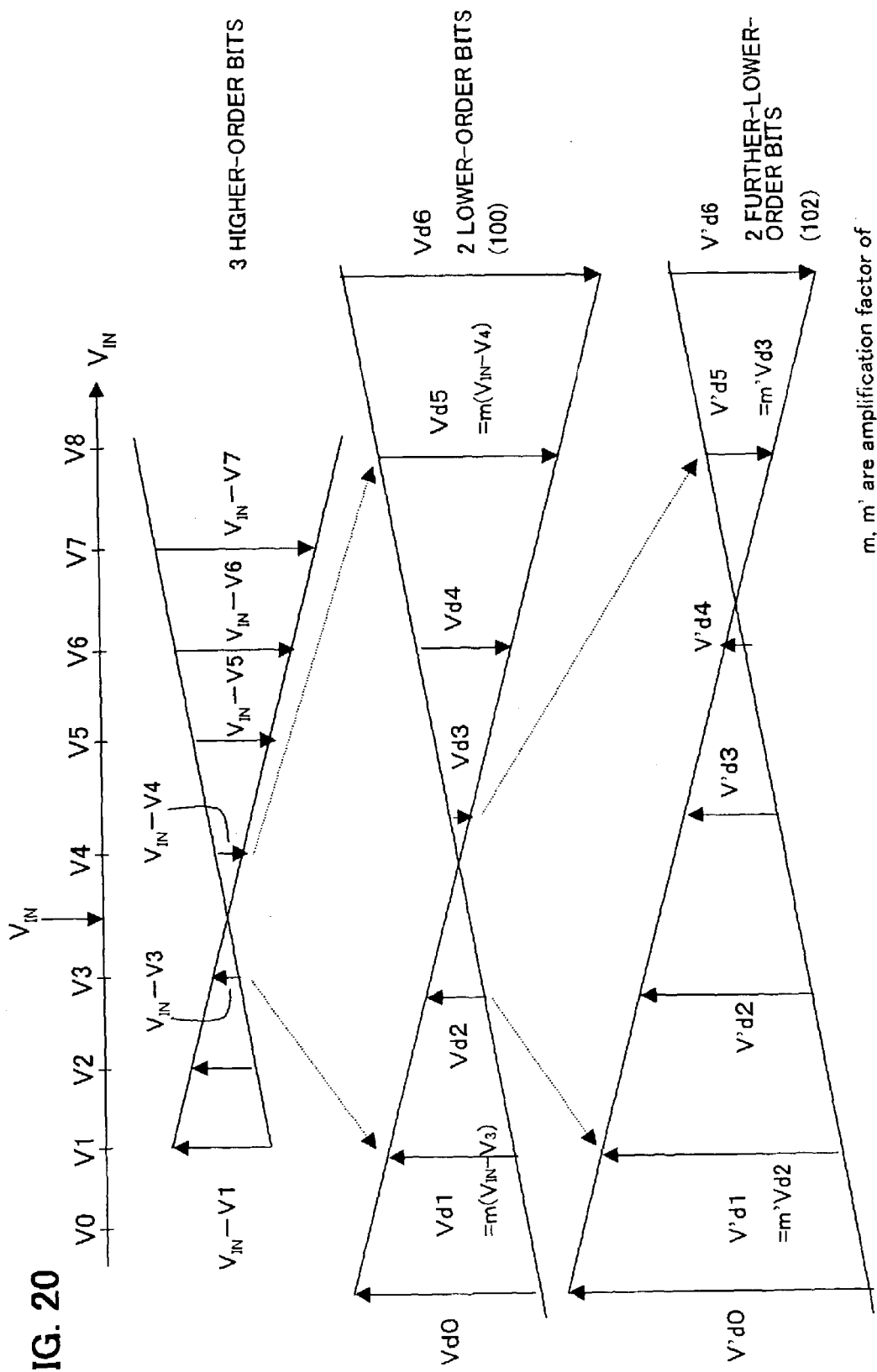
FIG. 20 illustrates the operation of the A/D conversion circuit shown in FIG. 19.

FIG. 20 illustrates the operation principle of the multi-stage A/D conversion circuit shown in FIG. 19. Similarly to FIG. 2, a conversion example of three higher-order bits is shown in FIG. 20. A conversion example (100) of two lower-order bits shown in FIG. 20 corresponds to the operation of the A/D conversion circuit 100 in the first stage shown in FIG. 19. A conversion example (102) of two further-lower-order bits shown in FIG. 20 corresponds to the operation of the A/D conversion circuit 102 in the second stage shown in FIG. 19.

In FIG. 20, when it is detected that the input voltage Vin is between the reference voltages V3 and V4 by a conversion of three higher-order bits, two differential output voltages of VIN-V3 and VIN-V4 are input into the A/D conversion circuit 100 for the two lower-order bits and the digital value of the two lower-order bits is detected. Since, at this moment, the extrapolation differential voltages Vd0 and Vd6 in addition to the interpolation differential voltages Vd1 to Vd5 have been generated in the A/D conversion circuit 100 in the first stage shown in FIG. 19, it is possible to detect which of the sides of the extrapolation differential voltages Vd0 and Vd6 the zero-crossing point corresponding to the input voltage Vin is on, in addition to detecting which of the positions of the interpolation differential voltages Vd1 to Vd5 the zero-crossing point is on.

Figure 21:
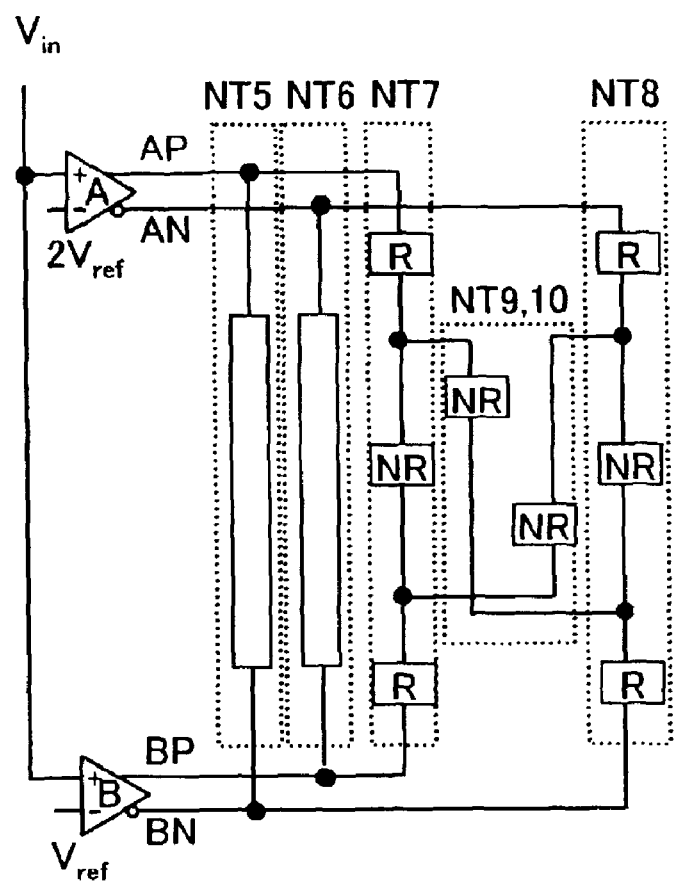
FIG. 21 illustrates the principle of an interpolation circuit according to a fifth embodiment.

In the example shown in FIG. 20, when it is as certained that there is a zero-crossing point between the interpolation differential voltages Vd2 and Vd3 in the two lower-order bits (100), the differential voltages Vd2 and Vd3 are input into differential amplifiers A' and B' in the second stage and are multiplied by a factor of m'. Then, new interpolation differential voltages V'd1 to V'd5 and new extrapolation differential voltages V'd0 and V'd6 are generated in the A/D conversion circuit 102 in the second stage. The digital value of two further-lower-order bits is detected by comparing those voltages in the comparator 20-2 in the second stage.
Fifth Embodiment FIG. 21 illustrates the principle of an interpolation circuit according to a fifth embodiment. In addition to the differential amplifiers A and B, the interpolation circuit according to the fifth embodiment has the voltage dividing element arrays NT7 to NT10 in the third and fourth embodiment (FIG. 11, FIG. 12, FIG. 15 and FIG. 16). Furthermore, the interpolation circuit according to the fifth embodiment has the voltage dividing element arrays NT5 and NT6 in the second embodiment (FIG. 7 and FIG. 8). That is, the interpolation differential voltages Vd1 to Vd5 are generated from the potential differences between nodes in the voltage dividing element arrays NT7 to NT10 (same as n30 to n39 shown in FIG. 12 and 16) and the extrapolation differential voltages Vd0 and Vd6 are generated from the potential differences between the nodes n20 to n23 in the voltage dividing arrays NT5 and NT6.

Figure 22:
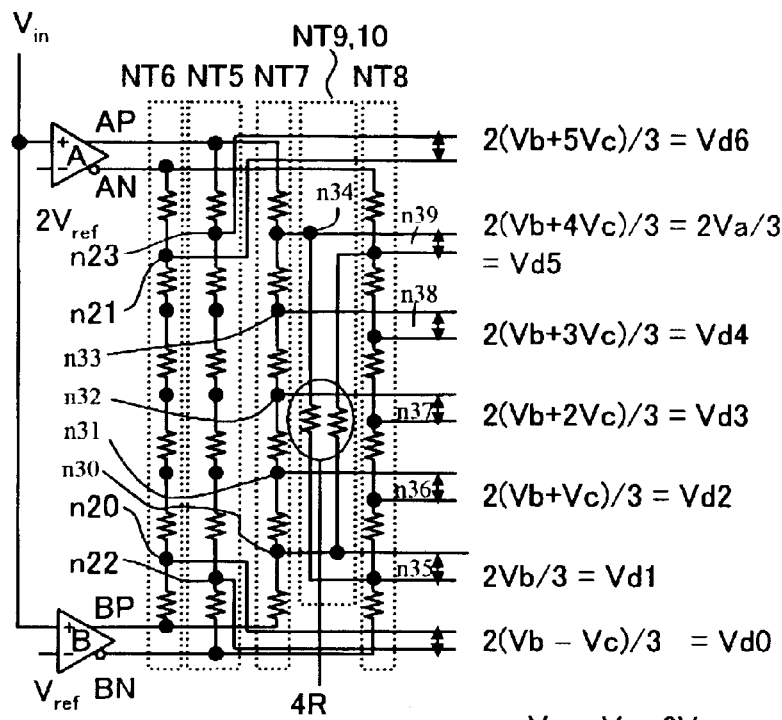
FIG. 22 is a circuit diagram of the interpolation circuit according to the fifth embodiment.

In FIG. 22, the differential voltages Vd0 to Vd6 increase by 2Vref/3 one after another from Vd0 to Vd6. Therefore, similarly to the fourth embodiment, an A/D conversion circuit can be constituted in a multi-stage configuration by utilizing this interpolation circuit.

Figure 23:
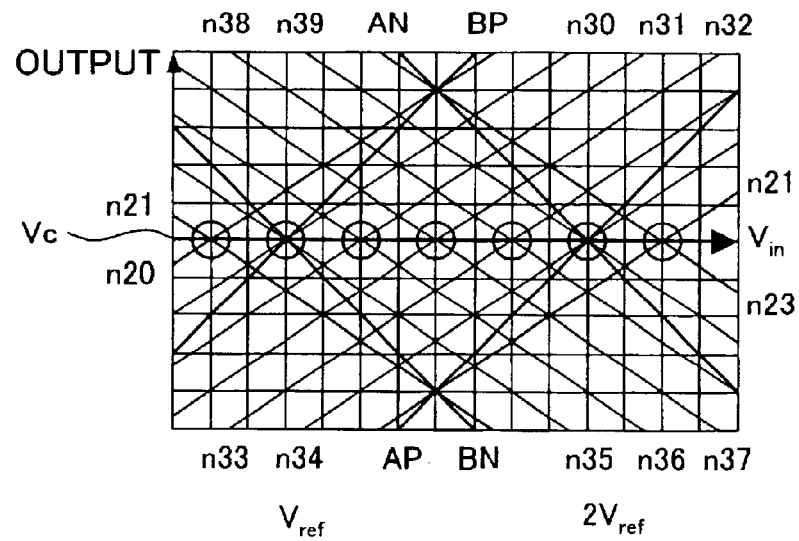
FIG. 23 is an input/output characteristic chart of the interpolation circuit according to the fifth embodiment.

FIG. 23 is an input/output characteristic chart of the interpolation circuit of the fifth embodiment. The variations of the input voltages at nodes n30 to n39 and n20 to n23 are shown by straight lines and the zero-crossing points between each pair of the nodes are indicate by circles. As apparent from this characteristic chart, the positions of the zero-crossing points line up along the axis of abscissas Vin in a line spacing equally to each other. This means that the common levels of angular differential voltages including the extrapolation differential voltages are all equal. Furthermore, since the spacing of the zero-crossing points is unified to 2Vref/3, this also means that a multi-stage A/D conversion circuit can be constituted by utilizing this interpolation circuit.

Figure 24:
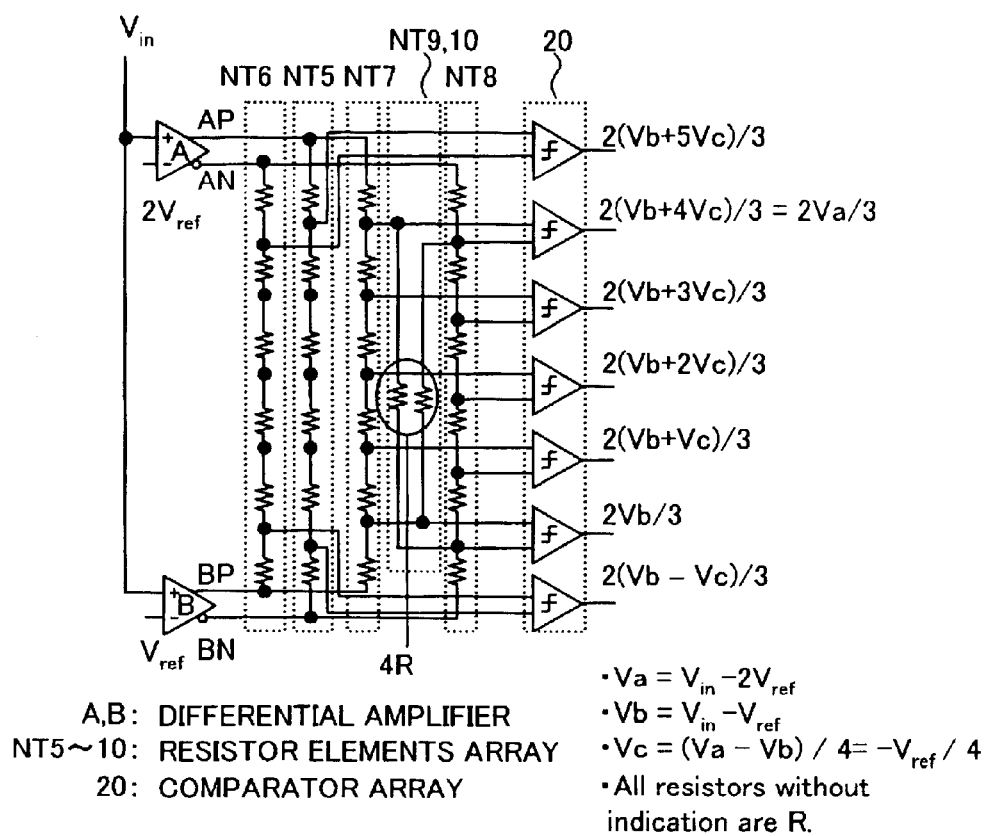
FIG. 24 is a circuit diagram of an A/D conversion circuit utilizing the interpolation circuit shown in FIG. 21.

FIG. 24 is a circuit diagram of an A/D conversion circuit utilizing the interpolation circuit shown in FIG. 22. The circuit shown in FIG. 22 is provided with the comparator 20 to which differential voltages of the interpolation circuit are input.

As described referring to FIG. 23, since the common level Vcom of the differential input voltages are equal in the A/D conversion circuit shown in FIG. 24, the range of the input common level to be guaranteed by the comparators 20 can be narrowed and, therefore, the circuit design of the comparators 20 can be simplified. Furthermore, since the potential differences of differential voltages are spaced equally, it is also possible to constitute the A/D conversion circuit in a multi-stage configuration.

Figure 25:
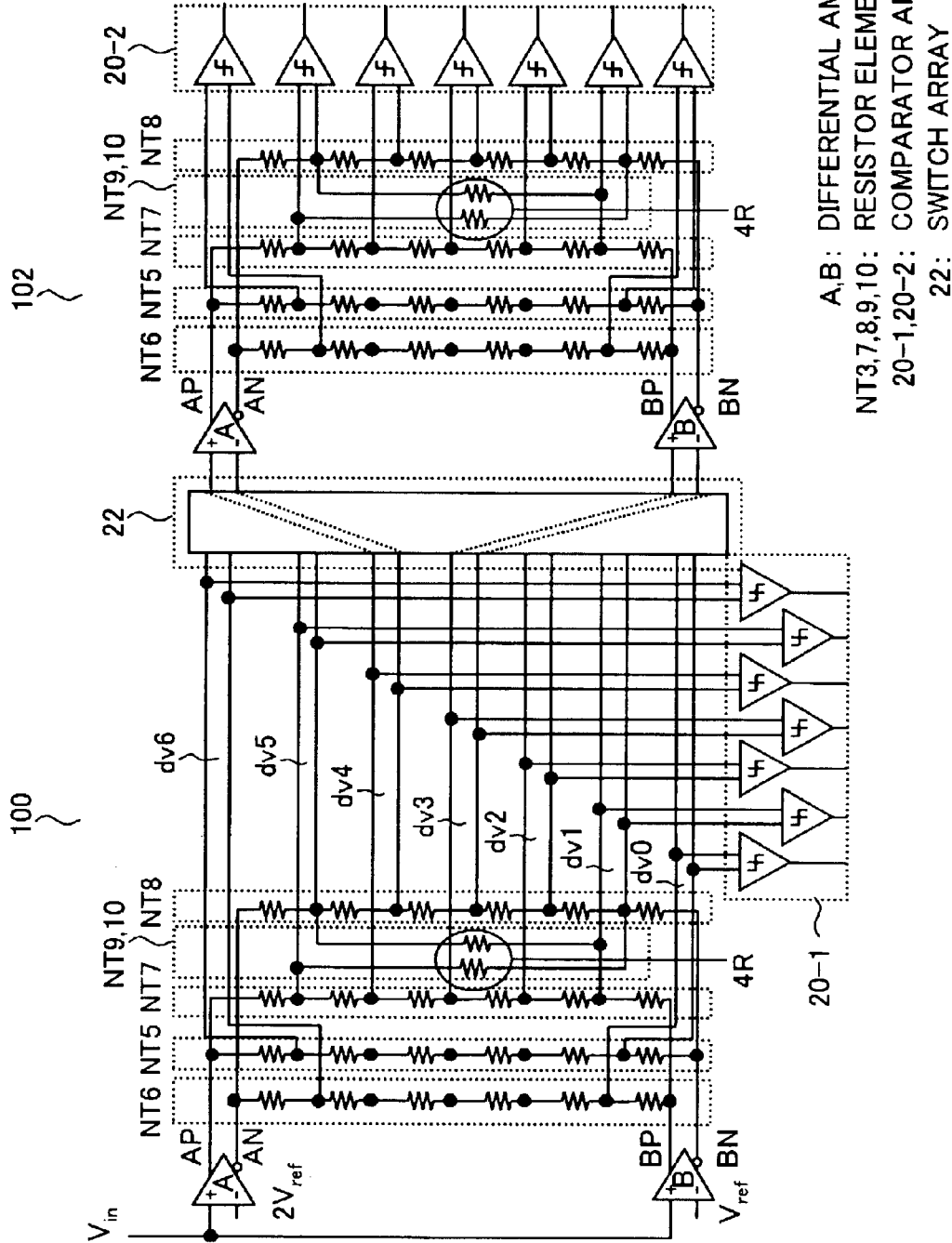
FIG. 25 shows an A/D conversion circuit of two stage configurated A/D conversion circuit shown in FIG. 23.

FIG. 25 shows an A/D conversion circuit constituted by constituting the A/D conversion circuit shown in FIG. 24 in a two-stage configuration. The A/D conversion circuit 100 in the first stage and the A/D conversion circuit 102 in the second stage are same as the circuits shown in FIG. 24 and a switch array 22 is provided between these circuits. This switch array connects adjacent differential voltages determined according to the output of the comparator array 20-1 in the first stage to the inputs of the pair of differential amplifiers A and B in the second stage. The operation of the multi-stage A/D conversion circuit shown in FIG. 25 is same as that shown in FIG. 20.

As described above, the interpolation circuit of the embodiment can be realized with a reduced circuit scale compared to the conventional examples. Furthermore, in the A/D conversion circuit, due to less variation in the common levels of the differential outputs of the interpolation circuit, the range of the input common levels to be guaranteed by the comparators can be narrowed and, therefore, it is advantageous in circuit designing. Yet furthermore, since the potential differences of the differential outputs of the interpolation circuit can be spaced equally, an A/D conversion circuit with a multi-stage configuration can be realized.

As set forth hereinabove, according to the invention there can be provided, with a reduced circuit scale, an interpolation circuit having a conversion error correction range for higher-order bits and an A/D conversion circuit utilizing the same.

What is claimed is:

1. An interpolation circuit for generating interpolation differential voltages and extrapolation differential voltages to a first and a second differential input voltages, comprising:

a first differential amplifier for inputting the first differential input voltage and generating a differential output voltage between an inverted output terminal and a non-inverted terminal thereof;

a second differential amplifier for inputting the second differential input voltage and generating a differential output voltage between an inverted output terminal and a non-inverted terminal thereof;

a first voltage dividing element array (NT1) disposed between the non-inverted output terminals of the first and the second differential amplifiers;

a second voltage dividing element array (NT2) disposed between the inverted output terminals of the first and the second differential amplifiers; and a third voltage dividing element array (NT3) disposed between the inverted output terminal of the first differential amplifier and the non-inverted output terminal of the second differential amplifier;

wherein the interpolation differential voltages are generated from nodes in the first voltage dividing element array and from nodes in the second voltage dividing element array, and the extrapolation differential voltages are generated from nodes in the third voltage dividing element array.

2. The interpolation circuit according to claim 1, wherein each of the first and the second voltage dividing element arrays has N voltage dividing elements connected in series, and each corresponding connection nodes of the voltage dividing elements thereof are connected respectively to each corresponding one of N−1 interpolation output terminal pairs, so that the interpolation differential voltages are output from the interpolation output terminal pairs, and wherein the third voltage dividing element array has a plurality of voltage dividing elements connected in series, a first and a second connection nodes of the voltage dividing elements and non-inverted output terminal and inverted output terminal of the first and the second differential amplifiers are connected respectively to a first and a second extrapolation output terminal pairs, so that the extrapolation differential voltages being output from the extrapolation output terminal pairs.

3. An A/D conversion circuit comprising:

the interpolation circuit according to claim 1 or 2; and a comparator array for inputting respectively the interpolation differential voltages and the extrapolation differential voltages so as to detect the polarity of the differential voltages.

4. An interpolation circuit for generating interpolation differential voltages and extrapolation differential voltages to a first and a second differential input voltages, comprising:

a first differential amplifier for inputting the first differential input voltage and generating a differential output voltage between an inverted output terminal and a non-inverted terminal thereof;

a second differential amplifier for inputting the second differential input voltage and generating a differential output voltage between an inverted output terminal and a non-inverted terminal thereof;

a first voltage dividing element array (NT1) disposed between the non-inverted output terminals of the first and the second differential amplifiers;

a second voltage dividing element array (NT2) disposed between the inverted output terminals of the first and the second differential amplifiers;

a fifth voltage dividing element array (NT5) disposed between the non-inverted output terminal of the first differential amplifier and the inverted output terminal of the second differential amplifier; and a sixth voltage dividing element array (NT6) disposed between the inverted output terminal of the first differential amplifier and the non-inverted output terminal of the second differential amplifier;

wherein the interpolation differential voltages are generated from nodes in the first voltage dividing element array and from nodes in the second voltage dividing element array, and the extrapolation differential voltages are generated from between nodes in the fifth voltage dividing element array and in the sixth voltage dividing element array.

5. The interpolation circuit according to claim 4, wherein each of the first and the second voltage dividing element arrays has N voltage dividing elements connected in series, and each corresponding connection nodes of the voltage dividing elements thereof are connected respectively to each corresponding one of N−1 interpolation output terminal pairs, so that the interpolation differential voltages are output from the interpolation output terminal pairs, and wherein each of the fifth and the sixth voltage dividing element arrays has a plurality of voltage dividing elements connected in series, each corresponding connection nodes of the voltage dividing elements thereof are connected respectively to the first and second extrapolation output terminal pairs, so that the extrapolation differential voltages being output from the extrapolation output terminal pairs.

6. An A/D conversion circuit comprising:

the interpolation circuit according to claim 4 or 5; and a comparator array for inputting respectively the interpolation differential voltages and the extrapolation differential voltages so as to detect the polarity of the differential voltages.

7. An interpolation circuit for generating interpolation differential voltages and extrapolation differential voltages to a first and a second differential input voltages, comprising:

a first differential amplifier for inputting the first differential input voltage and generating a differential output voltage between an inverted output terminal and a non-inverted terminal thereof;

a second differential amplifier for inputting the second differential input voltage and generating a differential output voltage between an inverted output terminal and a non-inverted terminal thereof;

a seventh voltage dividing element array (NT7) disposed between the non-inverted output terminals of the first and the second differential amplifiers;

an eighth voltage dividing element array (NT8) disposed between the inverted output terminals of the first and the second differential amplifiers;

a ninth voltage dividing element array (NT9) disposed between a first node in the seventh voltage dividing element array and a second node in the eighth voltage dividing element array; and a tenth voltage dividing element array (NT10) disposed between a second node in the seventh voltage dividing element array and a first node in the eighth voltage dividing element array;

wherein the interpolation differential voltages are generated from nodes in the seventh voltage dividing element array and from nodes in the eighth voltage dividing element array, and the extrapolation differential voltages are generated from nodes in the seventh or eighth voltage dividing element array and from nodes in the ninth or tenth voltage dividing element array.

8. The interpolation circuit according to claim 7, wherein each of the seventh and the eighth voltage dividing element arrays has N+2 voltage dividing elements connected in series, and each corresponding connection nodes of the N+2 voltage dividing elements thereof are connected respectively to each of N+1 interpolation output terminal pairs, so that the interpolation differential voltages are output from the interpolation output terminal pairs, and wherein each of the ninth and the tenth voltage dividing element arrays has a plurality of voltage dividing elements connected in series, and each of connection nodes of the voltage dividing elements in the ninth or the tenth voltage dividing element array and each of connection nodes of the voltage dividing elements in the seventh or eighth voltage dividing element array are connected to a first and a second extrapolation output terminal pairs, so that the extrapolation differential voltages are output from the extrapolation output terminal pairs.

9. An A/D conversion circuit comprising:

the interpolation circuit according to claim 7 or 8; and a comparator for inputting respectively the interpolation differential voltages and the extrapolation differential voltages so as to detect the polarity of the differential voltages.

10. An interpolation circuit for generating interpolation differential voltages and extrapolation differential voltages to a first and a second differential input voltages, comprising:

a first differential amplifier for inputting the first differential input voltage and generating a differential output voltage between an inverted output terminal and a non-inverted terminal thereof;

a second differential amplifier for inputting the second differential input voltage and generating a differential output voltage between an inverted output terminal and a non-inverted terminal thereof;

a seventh voltage dividing element array (NT7) disposed between the non-inverted output terminals of the first and the second differential amplifiers;

an eighth voltage dividing element array (NT8) disposed between the inverted output terminals of the first and the second differential amplifiers;

a ninth voltage dividing element array (NT9) disposed between a first node in the seventh voltage dividing element array and a second node in the eighth voltage dividing element array;

a tenth voltage dividing element array (NT10) disposed between a second node in the seventh voltage dividing element array and a first node in the eighth voltage dividing element array; and a third voltage dividing element array (NT3) disposed between the inverted output terminal of the first differential amplifier and the non-inverted output terminal of the second differential amplifier;

wherein the interpolation differential voltages are generated from nodes in the seventh voltage dividing element array and from nodes in the eighth voltage dividing element array, and the extrapolation differential voltages are generated from nodes in the third voltage dividing element array.

11. The interpolation circuit according to claim 10, wherein each of the seventh and the eighth voltage dividing element arrays has N+2 voltage dividing elements connected in series, and each corresponding connection nodes of the N+2 voltage dividing elements thereof are connected respectively to each of N+1 interpolation output terminal pairs, so that the interpolation differential voltages are output from the interpolation output terminal pairs, and wherein the third voltage dividing element array has a plurality of voltage dividing elements connected in series, and a first and a second connection nodes between the voltage dividing elements thereof and the non-inverted output terminal and inverted output terminal of the first and the second differential amplifiers are connected respectively to a first and a second extrapolation output terminal pairs, so that the extrapolation differential voltages are output from the extrapolation output terminal pairs.

12. An A/D conversion circuit comprising:

the interpolation circuit according to claim 10 or 11; and a comparator array for inputting respectively the interpolation differential voltages and the extrapolation differential voltages so as to detect the polarity of the differential voltages.

13. A multi-stage A/D conversion circuit comprising:

a plurality of the A/D conversion circuits according to claim 12 that are connected to each other in a multi-stage configuration.

14. An interpolation circuit for generating interpolation differential voltages and extrapolation differential voltages to a first and a second differential input voltages, comprising:

a first differential amplifier for inputting the first differential input voltage and generating a differential output voltage between an inverted output terminal and a non-inverted terminal thereof;

a second differential amplifier for inputting the second differential input voltage and generating a differential output voltage between an inverted output terminal and a non-inverted terminal thereof;

a seventh voltage dividing element array (NT7) disposed between the non-inverted output terminals of the first and the second differential amplifiers;

an eighth voltage dividing element array (NT8) disposed between the inverted output terminals of the first and the second differential amplifiers;

a ninth voltage dividing element array (NT9) disposed between a first node in the seventh voltage dividing element array and a second node in the eighth voltage dividing element array;

a tenth voltage dividing element array (NT10) disposed between a second node in the seventh voltage dividing element array and a first node in the eighth voltage dividing element array;

a fifth voltage dividing element array (NT5) disposed between the non-inverted output terminal of the first differential amplifier and the inverted output terminal of the second differential amplifier; and a sixth voltage dividing element array (NT6) disposed between the inverted output terminal of the first differential amplifier and the non-inverted output terminal of the second differential amplifier;

wherein the interpolation differential voltages are generated from nodes in the seventh voltage dividing element array and from nodes in the eighth voltage dividing element array, and the extrapolation differential voltages are generated from between nodes in the fifth voltage dividing element array and in the sixth voltage dividing element array.

15. The interpolation circuit according to claim 14, wherein each of the seventh and the eighth voltage dividing element arrays has N+2 voltage dividing elements connected in series, each corresponding connection nodes of the N+2 voltage dividing elements thereof are connected respectively to each of N+1 interpolation output terminal pairs, so that the interpolation differential voltages are output from the interpolation output terminal pairs, and wherein each of the fifth and sixth voltage dividing element arrays has a plurality of voltage dividing elements connected in series, and each corresponding connection nodes between the voltage dividing elements thereof are connected respectively to a first and a second extrapolation output terminal pairs, so that the extrapolation differential voltages are output from the extrapolation output terminal pairs.

16. An A/D conversion circuit comprising:

the interpolation circuit according to claim 14 or 15; and a comparator for inputting respectively the interpolation differential voltages and the extrapolation voltages so as to detect the polarity of the differential voltages.

17. A multi-stage A/D conversion circuit comprising:

a plurality of the A/D conversion circuits according to claim 16 which are connected to each other in a multi-stage configuration.

18. The multi-stage A/D conversion circuit according to claim 13 or 17, further comprising a switch array disposed between the A/D conversion circuits connected to each other in the multi-stage configuration, wherein the switch array supplies adjacent differential voltages to inputs of a first and a second differential amplifiers of the A/D conversion circuit at a second stage, according to an output of the A/D conversion circuit at a first stage.

* * * * *